(12) United States Patent
Miyashita et al.

(10) Patent No.: US 6,869,867 B2
(45) Date of Patent: Mar. 22, 2005

(54) SEMICONDUCTOR DEVICE COMPRISING METAL SILICIDE FILMS FORMED TO COVER GATE ELECTRODE AND SOURCE-DRAIN DIFFUSION LAYERS AND METHOD OF MANUFACTURING THE SAME WHEREIN THE SILICIDE ON GATE IS THICKER THAN ON SOURCE-DRAIN

(75) Inventors: Katsura Miyashita, Fujisawa (JP); Hisao Yoshimura, Kawasaki (JP); Mariko Takagi, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 09/916,530

(22) Filed: Jul. 30, 2001

(65) Prior Publication Data

US 2001/0045605 A1 Nov. 29, 2001

Related U.S. Application Data

(62) Division of application No. 09/164,343, filed on Oct. 1, 1998, now abandoned.

(30) Foreign Application Priority Data

Oct. 1, 1997 (JP) .............................................. 9-268513

(51) Int. Cl.[7] .................. H01L 21/336; H01L 21/3205; H01L 21/44

(52) U.S. Cl. ...................... 438/586; 438/301; 438/592; 438/649; 438/664; 438/647; 438/453

(58) Field of Search ................................ 438/586, 301, 438/592, 649, 664, 647, 453

(56) References Cited

U.S. PATENT DOCUMENTS 4,080,719 A  *  3/1978  Wilting ...................... 438/286
4,356,211 A  *  10/1982  Riseman ..................... 438/422

4,635,347 A  *  1/1987  Lien et al. ................... 438/301

(List continued on next page.)

FOREIGN PATENT DOCUMENTS

| JP | 62-66679 | 3/1987 |
| JP | 1-133368 | 5/1989 |
| JP | 3-209834 | 9/1991 |

(List continued on next page.)

*Primary Examiner*—John F. Niebling
*Assistant Examiner*—Ron Pompey
(74) *Attorney, Agent, or Firm*—Pillsbury Winthrop LLP

(57) ABSTRACT

The present invention provides a semiconductor device, comprising a semiconductor substrate, a gate insulating film formed on the semiconductor substrate, a gate electrode formed on the gate insulating film, and source-drain diffusion layer formed within the semiconductor substrate in the vicinity of the gate electrode. A silicide film is formed on each of the gate electrode and the source-drain diffusion layer. The silicide film positioned on the gate electrode is thicker than the silicide film positioned on the source-drain diffusion layer. The present invention also provides a method of manufacturing a semiconductor device, in which a gate electrode is formed on a gate insulating film covering a semiconductor substrate, followed by forming a source-drain diffusion layer within the semiconductor substrate. Then, atoms inhibiting a silicidation are selectively introduced into the source-drain diffusion layer, followed by forming a film of a metal having a high melting point on each of the gate electrode and the source-drain diffusion layer. The film of the high melting point metal is converted into a silicide film to form silicide films selectively on the gate electrode and the source-drain diffusion layer. The particular method permits retarding the formation of the silicide film on the source-drain diffusion layer so as to make it possible to obtain a semiconductor device of a salicide structure in which the silicide film formed on the gate electrode is thicker than the silicide film formed on the source-drain diffusion layer.

3 Claims, 9 Drawing Sheets

U.S. PATENT DOCUMENTS

| | | | |
|---|---|---|---|
| 5,545,574 A | * 8/1996 | Chen et al. | |
| 5,766,997 A | 6/1998 | Takeuchi | 438/257 |
| 5,883,418 A | 3/1999 | Kimura | 257/412 |
| 5,889,331 A | 3/1999 | Bai | 257/768 |
| 5,891,785 A | 4/1999 | Chang | 438/305 |
| 5,933,741 A | 8/1999 | Tseng | 438/306 |
| 5,970,334 A | 10/1999 | Tsuda | 438/231 |
| 5,970,380 A | 10/1999 | Lee | 438/682 |
| 6,060,387 A | 5/2000 | Shepela et al. | 438/630 |
| 6,100,189 A | 8/2000 | Hu et al. | 438/659 |

FOREIGN PATENT DOCUMENTS

| | | |
|---|---|---|
| JP | 4-230030 | 8/1992 |
| JP | 7-74128 | 3/1995 |
| JP | 8-64691 | 3/1996 |
| JP | 8-148561 | 6/1996 |
| JP | 8-330254 | 12/1996 |
| JP | 09-64349 | 3/1997 |
| JP | 9-162300 | 6/1997 |
| JP | 10-135152 | 5/1998 |

* cited by examiner

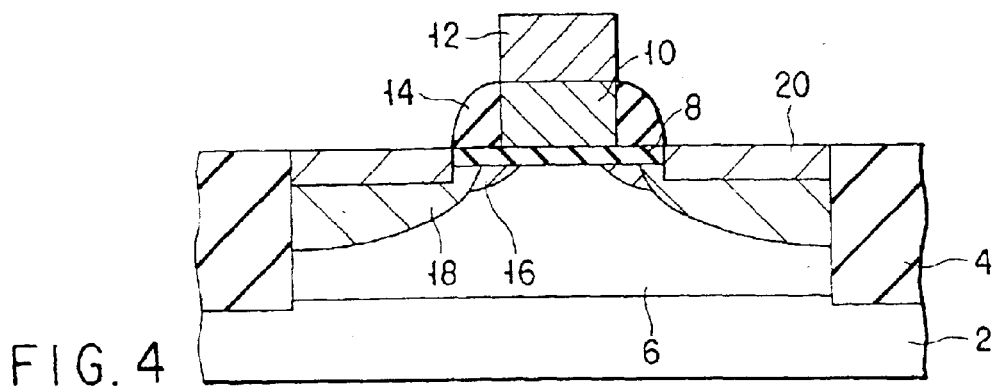
FIG. 4
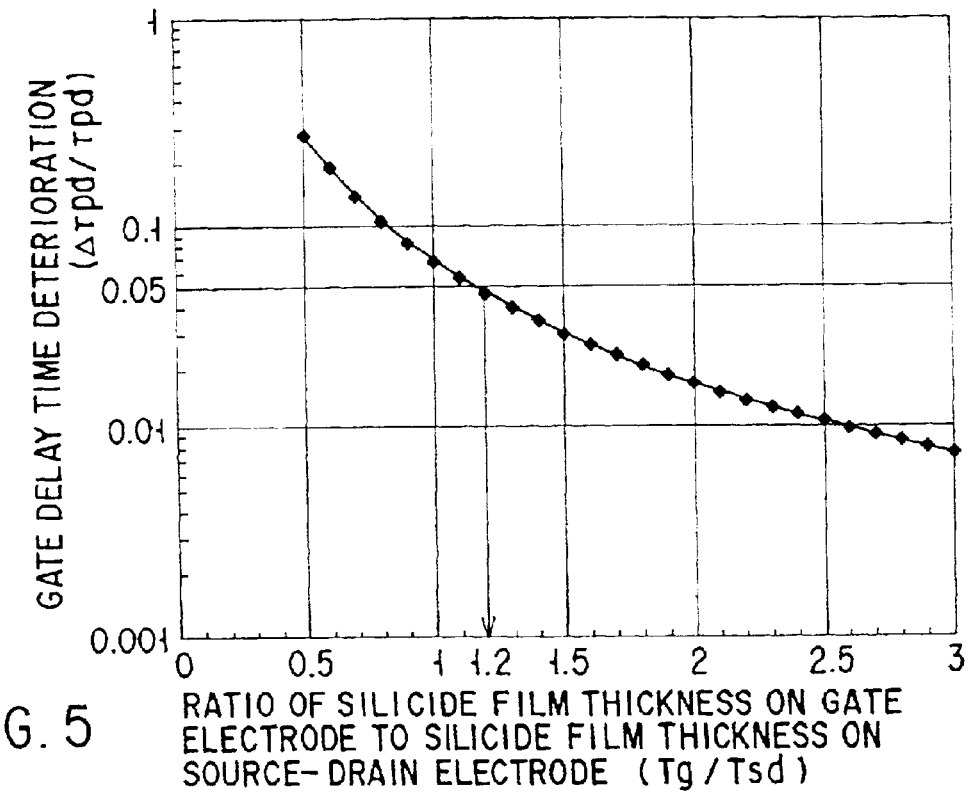
FIG. 5  RATIO OF SILICIDE FILM THICKNESS ON GATE ELECTRODE TO SILICIDE FILM THICKNESS ON SOURCE-DRAIN ELECTRODE (Tg/Tsd)
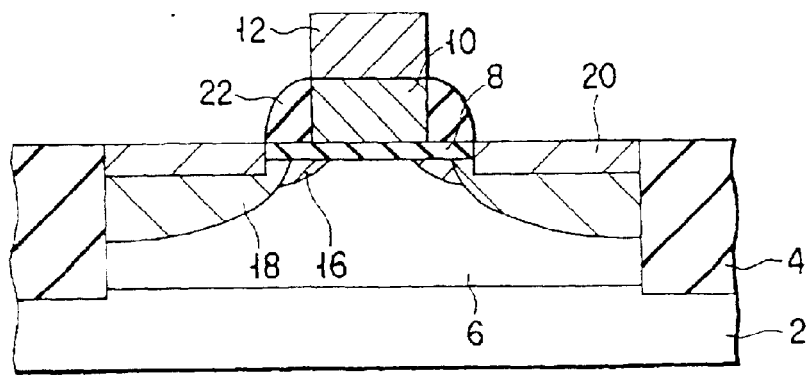
FIG. 6

US 6,869,867 B2

SEMICONDUCTOR DEVICE COMPRISING METAL SILICIDE FILMS FORMED TO COVER GATE ELECTRODE AND SOURCE-DRAIN DIFFUSION LAYERS AND METHOD OF MANUFACTURING THE SAME WHEREIN THE SILICIDE ON GATE IS THICKER THAN ON SOURCE-DRAIN

This is a Divisional application Ser. No. 09/164,343 filed Oct. 1, 1998 now Abandoned.

BACKGROUND OF THE INVENTION

The present invention relates to a semiconductor device of a MIS (metal-insulator-semiconductor) structure, particularly to a semiconductor device comprising metal silicide films formed to cover a gate electrode and source-drain diffusion layers and a method of manufacturing the same.

In recent years, a semiconductor device of a CMOS (Complementary Metal Oxide Semiconductor) structure, which is a typical MIS structure, has achieved marked improvements in the degree of integration by miniaturization and in the operation speed.

With progress in the miniaturization, particularly, in the quarter micron or smaller, a ratio of the delay caused by a parasitic element such as resistance and capacitance to the intrinsic delay component of a transistor is increased, making it absolutely necessary to decrease the resistance of the source-drain regions and the gate electrode in order to achieve a high speed operation of the device.

As a means for decreasing the resistance, known is a salicide structure in which a silicide film is formed selectively to cover source-drain diffusion layers and a gate electrode. For forming the salicide structure, a metal having a high melting point such as Ti, Co, or Ni is deposited by, for example, a sputtering method on a semiconductor substrate having source-drain diffusion layers and a gate electrode formed thereon, followed by applying an annealing treatment to the substrate so as to convert the high melting point metal deposited on the source-drain diffusion layers and the gate electrode into a silicide and subsequently removing selectively the unreacted high melting point metal. As a result, a silicide film of a low resistivity is formed by self-alignment selectively on the source-drain diffusion layers and the gate electrode. The structure formed by the particular method of forming a silicide film is called a salicide structure.

FIG. 1 is a cross sectional view exemplifying a basic construction of a field effect transistor of MOS structure (MOS-FET) using the salicide structure. As shown in the drawing, a well 108 is formed within a silicon semiconductor substrate 101. A gate electrode 103 consisting of polycrystalline silicon is formed on a surface of the well 108 with a gate oxide film 102 interposed therebetween. A gate side wall film 104 consisting of a silicon nitride film is formed on the side surface of the gate electrode 103.

Further, a shallow source-drain diffusion layer 105 and a deep source-drain diffusion layer 106 are formed below the gate side wall film 104. Still further, a silicide film 107 is formed on the deep source-drain diffusion layer 106 and on the gate electrode 103.

The silicide film 107 is formed as follows. Specifically, after formation of the deep source-drain diffusion layer 106, a metal film having a high melting point is deposited in a thickness of about 30 nm on the semiconductor substrate including the deep source-drain diffusion layer 106 and the gate electrode 103. Then, an annealing treatment is applied to the metal film on the deep source-drain diffusion layer 106 and the gate electrode 103 so as to convert the metal layer into a silicide layer, followed by selectively removing the unreacted high melting point metal. As a result, the silicide film 107 is formed by self-alignment on selectively the deep source-drain diffusion layer 107 and the gate electrode 103.

In the semiconductor device employing the conventional salicide structure as shown in FIG. 1, it is necessary to form the source-drain diffusion layer deep. Where the source-drain diffusion layer is formed shallow, silicon in the source-drain diffusion layer is consumed in the step of forming the silicide in the salicide structure, with the result that leakage at the junction is generated. Incidentally, a ratio in the thickness of the consumed silicon film to a unit thickness of the metal film in the step of forming the silicide is 2.27 in the case of forming titanium silicide ($TiSi_2$), 3.64 in the case of forming cobalt silicide ($CoSi_2$) and 1.83 in the case of forming nickel silicide (NiSi).

It should be noted that, where a shallow junction is formed as a source-drain diffusion layer in the MOSFET using the conventional silicide film, a junction leakage is generated at the shallow junction portion. In order to prevent the junction leakage, it is necessary to form a deep junction as a source-drain diffusion layer.

Let us describe the problem which is to be solved by the present invention.

As described above, if a deep junction is formed as a source-drain diffusion layer, generation of a short channel effect is rendered prominent in the MOSFET. As a result, it is necessary to ensure a sufficient width of the gate side wall film, which inhibits miniaturization of the semiconductor device.

In the case of employing the salicide structure, the contact resistance at the interface between the silicide film and the silicon layer and the resistance of the shallow junction portion occupy a very high ratio relative to the entire parasitic resistance at the source-drain diffusion layer. Thus, the parasitic resistance is not significantly changed even if the sheet resistance of the silicide film formed on the diffusion layer is changed. It follows that, if the parasitic resistance is set at about 5% of the intrinsic resistance, it is possible to decrease the thickness of the silicide film formed on the diffusion layer, though it is necessary to diminish the parasitic resistance with progress in miniaturization of the semiconductor device.

On the other hand, in order to achieve a high speed operation, it is necessary to decrease the gate delay time of, for example, the CMOS inverter. To achieve the object, it is necessary to form a gate electrode of a low resistance.

FIG. 2 shows the sheet resistance of a silicide film positioned on the source-drain diffusion layer and on the gate electrode required for the gate length of each semiconductor era.

On the other hand, the sheet resistance of a silicide film is inversely proportional to the thickness of the silicide film, if it is assumed for the sake of simplification that the resistivity of the silicide film does not depend on the size, that is, if it is assumed that a so-called "fine wire effect" does not exist and, thus, the resistivity of the silicide film is not changed by the thinning of the film. It follows that it is necessary to increase in the future the thickness of the silicide film positioned on the gate electrode with decrease in the gate length.

BRIEF SUMMARY OF THE INVENTION

An object of the present invention, which has been achieved in view of the situation described above, is to provide a semiconductor device having a salicide structure, in which the silicide film positioned on the gate electrode is made thicker than the silicide film positioned on the source-drain diffusion layer so as to make it possible to promote miniaturization and increase the operating speed of the semiconductor device.

Another object is to provide a method of manufacturing a semiconductor device having a salicide structure, which permits making the silicide film positioned on the gate electrode thicker than the silicide film positioned on the source-drain diffusion layer.

According to an aspect of the present invention, which is intended to achieve the object described above, there is provided a semiconductor device comprising a source-drain diffusion layer formed in a semiconductor substrate, a first silicide film formed on the source-drain diffusion layer, a gate electrode formed on a gate insulating film positioned on the semiconductor substrate, and a second silicide film positioned on the gate electrode and thicker than the first silicide film.

In the semiconductor device of the particular construction, the silicide film positioned on the gate electrode is thicker than the silicide film positioned on the source-drain diffusion layer, making it possible to promote miniaturization and to increase the operating speed of the semiconductor device.

According to another aspect of the present invention, there is provided a method of manufacturing a semiconductor device, comprising the step of forming a gate insulating film on a semiconductor substrate, the step of forming a gate electrode on the gate insulating film, the step of forming a source-drain diffusion layer in the semiconductor substrate, the step of selectively introducing into the source-drain diffusion layer atoms which inhibit silicidation, the step of forming a film of a metal having a high melting point on the gate electrode and on the source-drain diffusion layer, and the step of converting the high melting point metal film into a silicide film to form a silicide film selectively on the gate electrode and on the source-drain diffusion layer.

In the method of the present invention for manufacturing a semiconductor device, atoms inhibiting silicidation are selectively introduced into the source-drain diffusion layer so as to retard formation of a silicide film on the source-drain diffusion layer, with the result that the silicide film positioned on the gate electrode is rendered thicker than the silicide film positioned on the source-drain diffusion layer.

According to another aspect of the present invention, there is provided a method of manufacturing a semiconductor device, comprising the step of forming a gate insulating film on a semiconductor substrate, the step of forming a gate electrode on the gate insulating film, the step of forming a source-drain diffusion layer in the semiconductor substrate, the step of forming a film which inhibits silicidation on the source-drain diffusion layer, the step of forming a film of a metal having a high melting point on the gate electrode and on the source-drain diffusion layer, and the step of converting the film of the high melting point metal into a silicide film to form a silicide film selectively on the gate electrode and on the source-drain diffusion layer.

According to the particular manufacturing method of the present invention, a film, e.g., an oxide film, which inhibits silicidation, is selectively formed on the source-drain diffusion layer so as to retard silicidation of the film of the high melting point metal positioned on the source-drain diffusion layer. It follows that the silicide film positioned on the gate electrode can be made thicker than the silicide film positioned on the source-drain diffusion layer.

According to another aspect of the present invention, there is provided a method of manufacturing a semiconductor device, comprising the step of forming a gate insulating film on a semiconductor substrate, the step of forming a gate electrode on the gate insulating film, the step of forming a source-drain diffusion layer in the semiconductor substrate, the step of forming an insulating film on the gate electrode and on the source-drain diffusion layer, the step of thinning the insulating film so as to expose the surface of the gate electrode with the source-drain diffusion layer kept covered with the insulating film, the step of introducing atoms into a region around the surface of the gate electrode so as to make the upper portion of the gate electrode amorphous, the step of removing the insulating film positioned on the source-drain diffusion layer, the step of forming a film of a metal having a high melting point on the gate electrode and on the source-drain diffusion layer, and the step of converting the film of the high melting point metal into a silicide film to form a silicide film selectively on the gate electrode and on the source-drain diffusion layer.

According to the particular manufacturing method of the present invention, an amorphous layer is formed selectively on an upper portion of the gate electrode so as to promote silicidation in the upper portion of the gate electrode. It follows that the silicide film positioned on the gate electrode can be made thicker than the silicide film positioned on the source-drain diffusion layer.

According to another aspect of the present invention, there is provided a method of manufacturing a semiconductor device, comprising the step of forming a gate insulating film on a semiconductor substrate, the step of forming an amorphous silicon film having a shape of a gate electrode on the gate insulating film, the step of forming a source-drain diffusion layer in the semiconductor substrate, the step of forming a film of a metal having a high melting point on the amorphous silicon film and on the source-drain diffusion layer, and the step of converting the film of the high melting point metal into a silicide film to form a silicide film selectively on the amorphous silicon film and on the source-drain diffusion layer.

According to the particular manufacturing method of the present invention, the gate electrode is formed by using amorphous silicon. As a result, the silicide forming-rate on the gate electrode is promoted so as to make the silicide film positioned on the gate electrode thicker than the silicide film positioned on the source drain diffusion layer.

According to another aspect of the present invention, there is provided a method of manufacturing a semiconductor device, comprising the step of forming a gate insulating film on a semiconductor substrate, the step of forming a gate electrode on the gate insulating film, the step of forming a source-drain diffusion layer in the semiconductor substrate, the step of forming a silicide film selectively on the gate electrode and on the source-drain diffusion layer, the step of forming an insulating film on the silicide film positioned on the gate electrode and on the source-drain diffusion layer, the step of thinning the insulating film to expose the surface of the silicide film positioned on the gate electrode with the silicide film, which is positioned on the source-drain diffusion layer, kept covered with the insulating film, and the step of further forming a silicide film on the surface of the exposed silicide film.

In the particular manufacturing method of the present invention, a silicide film is formed by the known method, followed by covering the entire surface of the semiconductor substrate with an insulating film. Then, the surface of the silicide film positioned on the gate electrode is selectively exposed to the outside, followed by further forming a silicide film selectively on the exposed silicide film positioned on the gate electrode. As a result, the silicide film positioned on the gate electrode is made thicker than the silicide film positioned on the source-drain diffusion layer.

Further, according to still another aspect of the present invention, there is provided a method of manufacturing a semiconductor device, comprising the step of forming a gate insulating film on a semiconductor substrate, the step of forming a gate electrode on the gate insulating film, the step of forming a source-drain diffusion layer in the semiconductor substrate, the step of forming a film of a metal having a high melting point on the gate electrode and on the source-drain diffusion layer, the step of converting the film of the high melting point metal into a silicide film so as to form a silicide film selectively on the gate electrode and on the source-drain diffusion layer, the step of forming an insulating film on the silicide film positioned on the gate electrode and on the source-drain diffusion layer, the step of thinning the insulating film to expose the surface of the silicide film positioned on the gate electrode with the silicide film, which is positioned on the source-drain diffusion layer, kept covered with the insulating film, the step of forming a film of a high melting point metal on the silicide film positioned on the gate electrode, and the step of converting the film of the high melting point metal into a silicide film so as to form a silicide film selectively on the silicide film formed previously on the gate electrode.

In the particular manufacturing method of the present invention, a silicide film is formed by a known method, followed by covering the entire surface of the semiconductor substrate with an insulating film. Then, the surface of the silicide film positioned on the gate electrode is selectively exposed to the outside, followed by further forming a silicide film selectively on the silicide film formed previously on the gate electrode. It follows that the silicide film positioned on the gate electrode can be made thicker than the silicide film positioned on the source-drain diffusion layer.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 4 is a cross sectional view showing the construction of a semiconductor device having a salicide structure according to a first embodiment of the present invention;

FIG. 5 is a graph showing the influences given by the gate electrode resistance to the gate delay time in a semiconductor device of 0.25 $\mu$m era;

FIG. 6 is a cross sectional view showing a semiconductor device having a salicide structure according to a modification of the first embodiment of the present invention;

DETAILED DESCRIPTION OF THE INVENTION

Figure 1:
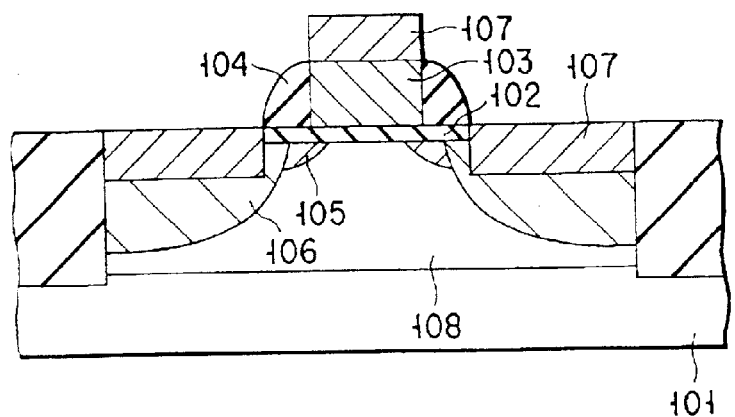
FIG. 1 is a cross sectional view exemplifying the basic construction of a semiconductor device having a MOS structure using a salicide technique.
Figure 2:
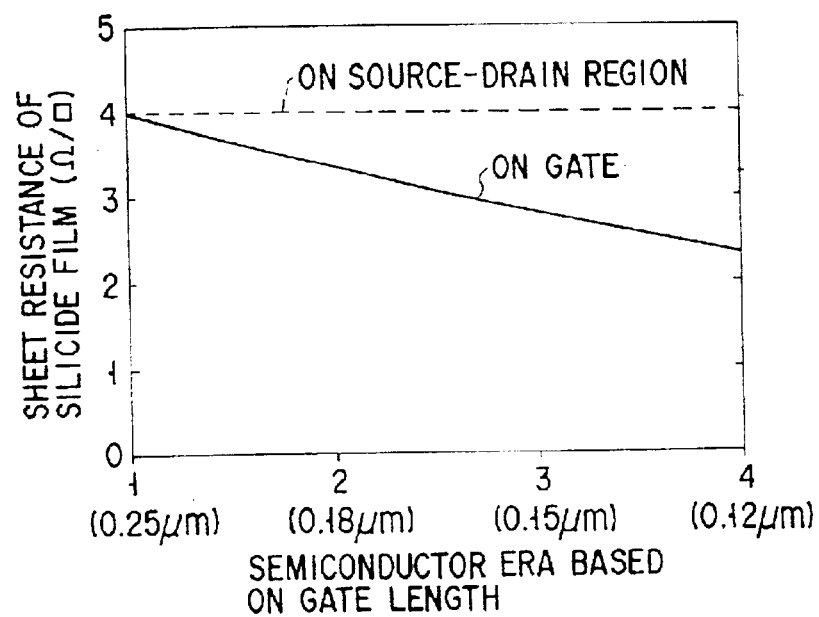
FIG. 2 is a graph showing the sheet resistance of a silicide film positioned on the source-drain diffusion layer and on the gate electrode, which is required for the gate length for each semiconductor era.
Figure 3:
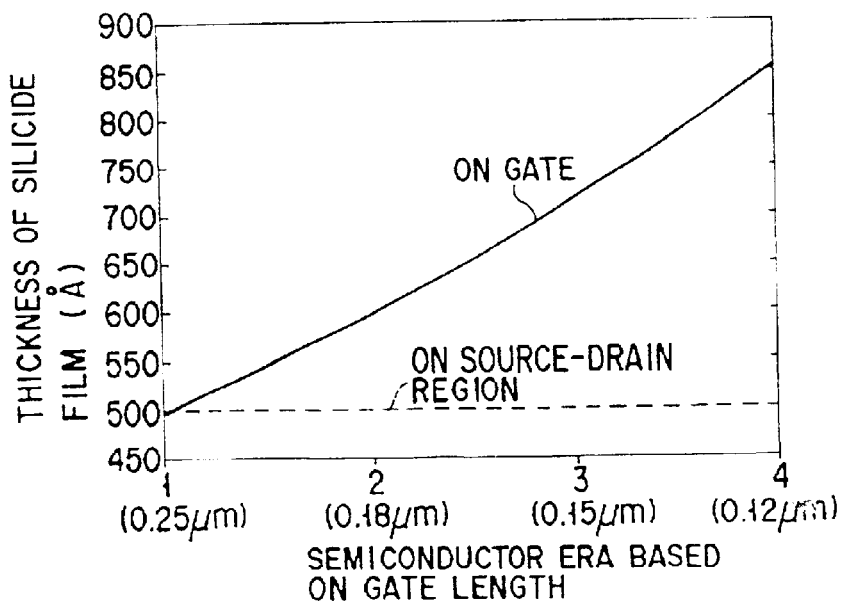
FIG. 3 is a graph showing the thickness of a silicide film positioned on the source-drain diffusion layer and on the gate electrode, which is required for the gate length for each semiconductor era.

Let us describe some embodiments of the present invention with reference to the accompanying drawings.

First Embodiment

Let us describe a semiconductor device having a salicide structure as a first embodiment of the present invention.

Specifically, FIG. 4 is a cross sectional view showing the construction of a semiconductor device having a salicide structure. As shown in the drawing, an element isolating region 4 is formed on a silicon semiconductor substrate 2, and a well 6 is formed in an element forming region defined between two adjacent element isolating regions 4. Further, a gate insulating film 8 consisting of a silicon oxide film is formed in an active element region included in the element forming region.

A gate electrode of a polycide type consisting of a polycrystalline silicon film 10 and a silicide film 12 formed on the polycrystalline silicon film 10 is formed on the gate insulating film 8. The silicide film 12 consists of, for example, a titanium silicide ($TiSi_2$) film, a cobalt silicide ($CoSi_2$) film or a nickel silicide (NiSi) film. Further, gate side wall films 14 each consisting of a silicon nitride film are formed both side walls of the gate electrode.

A shallow diffusion layer 16 acting as a source or drain region is formed within the well 6 so as to be positioned below the gate side wall film 14. Further, a deep diffusion layer 18, which also acts as a source or drain region, is formed outside the shallow diffusion layer 16 in respect of the gate electrode. Still further, a silicide film 20 is formed on the deep diffusion layer 18. The silicide film 20 consists of, for example, a titanium silicide ($TiSi_2$) film, a cobalt silicide ($CoSi_2$) film or a nickel silicide (NiSi) film. Also, the semiconductor device has at least one of the three types given below.

Specifically, at least one of fluorine, nitrogen and oxygen atoms is present in at least one of the silicide film 20 and the deep diffusion layer 18.

Alternatively, at least one of germanium (Ge), boron (B), silicon (Si), arsenic (As) and antimony (Sb) atoms is present in at least one of the silicide film 12 and the polycrystalline silicon film 10.

Figure 32:
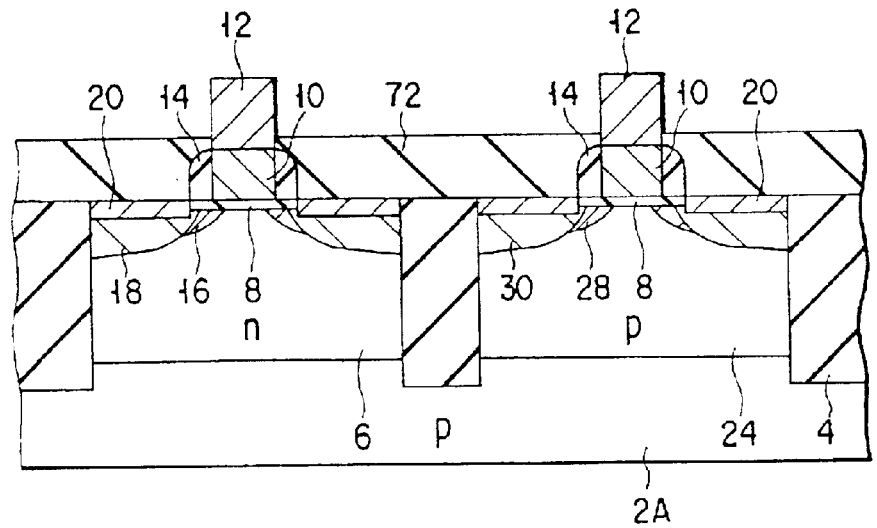
FIG. 32 is a cross sectional view showing still another step included in a method of manufacturing a semiconductor device having a salicide structure shown in FIG. 4 according to a sixth embodiment of the present invention.

Further, a silicon nitride film is formed on the entire surface of the semiconductor substrate including the upper surface of the silicide film 20 and excluding the upper surface of the silicide film 12, as shown in FIG. 32.

In a semiconductor device having a salicide structure described above, the silicide film 12 formed on the polycrystalline silicon film 10 included in the gate electrode has thickness which is at least 1.2 times, preferably at least 2 times, as much as the thickness of the silicide film 20 formed on the deep diffusion layer 18 constituting a source or drain region. For example, the thickness of the silicide film 12 included in the gate electrode is set at 60 nm or more, and the thickness of the silicide film 20 formed on the deep diffusion layer 18 is set at 50 nm or less.

The reason for making the silicide film 12 included in the gate electrode at least 1.2 times as thick as the silicide film 20 positioned on the deep diffusion layer 18 is as follows.

Specifically, FIG. 5 is a graph showing the influence given by the gate electrode resistance to the gate delay time in the semiconductor era of 0.25 $\mu$m, which was calculated by using "Sakurai model". Plotted on the abscissa of the graph is a ratio in thickness of the silicide film included in the gate electrode to the silicide film positioned on the source-drain diffusion layer, i.e., Tg/Tsd, covering the case where the resistance of the silicide film positioned on the source-drain diffusion layer is fixed at 10 [$\Omega$/sq.]. On the other hand, plotted on the ordinate of the graph is a gate delay time deterioration ($\Delta\tau pd/\tau pd$). The term "gate delay time deterioration" denotes a deterioration rate of the intrinsic gate delay time of the transistor caused by the gate electrode resistance. The calculating conditions were: $\Delta\tau pd/\tau pd=(\frac{1}{3})\times(Rg\times Cg/\tau pd)^2$, $\tau pd=30$ ps, $Cg=L\times W\times 6$ $fF/\mu m^2$, $W=15$ $\mu$m, $L=0.25$ $\mu$m, and $\rho sd=10$ $\Omega$/sq.

Suppose a maximum channel width W is set at, for example, 15 $\mu$m in designing the circuit. In this case, it can be understood that the silicide film included in the gate electrode is required to be at least 1.2 times as thick as the silicide film positioned on the source-drain diffusion layer in order to suppress the deterioration caused by the gate electrode resistance at 5% (0.05) or less.

The "Sakurai model" referred to above is described in "IEEE Trans. on ED, ED-32, 2, Feb. 1985, pp. 370–374, 'Gate Electrode RC Delay Effects in VLSI' by T. Sakurai and T. Iizuka".

In the first embodiment of the present invention, the silicide film 12 and the silicide film 20 may be any of a titanium silicide film, a cobalt silicide film and a nickel silicide film as described previously. It is also possible for these silicide films 12 and 20 to consist of a silicide of a metal having a high melting point.

The gate insulating film 8 consists of a silicon oxide film in the embodiment described above. Alternatively, another insulating film such as a silicon nitride film or a silicon oxynitride film can also be used as the gate insulating film 8. Further, the silicon semiconductor substrate 2 may be of either a p-type or n-type conductivity.

As described above, in the first embodiment of the present invention, the silicide film 12 included in the gate electrode is formed thicker than the film widely used in the conventional semiconductor device. Also, the silicide film 20 positioned on the source-drain diffusion layer is formed thinner than the film widely used in the conventional semiconductor device. What should also be noted is that the semiconductor device according to the first embodiment of the present invention includes a salicide structure in which the silicide film 12 is at least 1.2 times as thick as the silicide film 20. The particular construction employed in the first embodiment of the present invention makes it possible to lower the resistance of the gate electrode while suppressing the current leakage at the junction of the shallow source-drain diffusion layer. It follows that it is possible to provide a miniaturized MIS transistor capable of a high speed operation.

Let us describe another semiconductor device having a salicide structure as a modification of the first embodiment of the present invention.

Specifically, FIG. 6 shows the construction of a semiconductor device having a salicide structure, which is a modification of the first embodiment of the present invention. In the first embodiment shown in FIG. 4, the gate side wall film 14 formed to cover the both side surfaces of the gate electrode consists of a silicon nitride film. In the modification shown in FIG. 6, however, a gate side wall film 22 consisting of a silicon oxide film is formed in place of the gate side wall film 14 included in the semiconductor device shown in FIG. 4, said film 14 consisting of a silicon nitride film. The semiconductor device shown in FIG. 6 is equal to the device shown in FIG. 4 in the other portions. Therefore, the same reference numerals are put to the drawings of the FIGS. 4 and 6 for these portions for omitting the description thereof.

In the modification shown in FIG. 6, the silicide film 12 included in the gate electrode is formed thicker than the film widely used in the conventional semiconductor device. Also, the silicide film 20 positioned on the source-drain diffusion layer is formed thinner than the film widely used in the conventional semiconductor device. What should also be noted is that the semiconductor device according to-the modification shown in FIG. 6 includes a salicide structure in which the silicide film 12 is at least 1.2 times as thick as the silicide film 20. The particular construction employed in this modification makes it possible to lower the resistance of the gate electrode while suppressing the current leakage at the junction of the shallow source-drain diffusion layer. It follows that it is possible to provide a miniaturized MIS transistor capable of a high speed operation.

Suppose a maximum channel width W is set at, for example, 15 μm in designing the circuit in this modification. In this case, it can be understood from FIG. 5 that the silicide film 12 included in the gate electrode is required to be at least 1.2 times as thick as the silicide film 20 positioned on the source-drain diffusion layer in order to suppress the deterioration caused by the gate electrode resistance at 5% (0.05) or less, as in the first embodiment. Therefore, the silicide film 12 included in the gate electrode is formed at least 1.2 times as thick as the silicide film 20 positioned on the source-drain diffusion layer.

Second Embodiment

Let us describe a method of manufacturing a semiconductor device of the first embodiment of the present invention shown in FIG. 4, which has a salicide structure, as a second embodiment of the present invention. In the second embodiment, each of the silicide films 12 and 20 consists of a titanium silicide. Also, the silicon semiconductor substrate 2 has a p-type conductivity.

FIGS. 7 to 12 are cross sectional views collectively showing a method of manufacturing the semiconductor device according to the second embodiment of the present invention. In the method of the second embodiment of the present invention, manufactured is a semiconductor device according to the first embodiment of the present invention, which has a salicide structure and is shown in FIG. 4.

Figure 7:
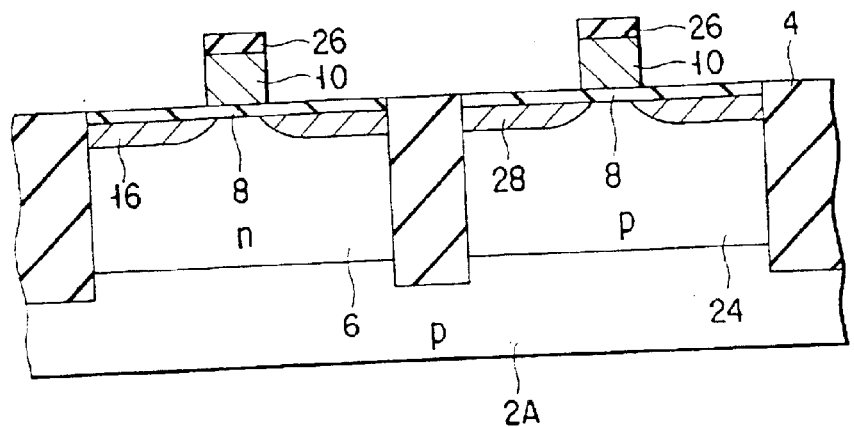
FIG. 7 is a cross sectional view showing a step included in a method of manufacturing a semiconductor device having a salicide structure shown in FIG. 4 according to a second embodiment of the present invention.

In the first step, an element isolation region 4 is formed in a depth of about 300 nm by a buried element separation method on a p-type silicon semiconductor substrate 2A, as shown in FIG. 7. Then, a buffer oxide film is formed in a thickness of about 10 nm on the p-type silicon semiconductor substrate 2A in an element forming region positioned between the adjacent element separation regions 4.

After formation of the buffer oxide film, an n-well 6, a p-well 24 and a channel are formed in the element forming region on the p-type silicon semiconductor substrate 2A by an ion implantation method. The ion implantation is carried out under the ordinary conditions employed for forming these regions. For example, for forming the n-type well 6, phosphorus ions (P$^-$) are implanted under an accelerating energy of 500 keV and at a dose of $3 \times 10^{13}$ cm$^{-2}$. For forming the channel region in the n-type well 6, boron ions (B$^+$) are implanted under an accelerating energy of 50 keV and at a dose of $1.5 \times 10^{13}$ cm$^{-2}$. For forming the p-type well 24, boron ions (B$^+$) are implanted at an accelerating energy of 260 keV and at a dose of $2 \times 10^{13}$ cm$^{-2}$. Further, for forming the channel region in the p-type well 24, phosphorus ions (P$^-$) are implanted under an accelerating energy of 130 keV and at a dose of $1.0 \times 10^{13}$ cm$^{-2}$.

After the ion implantation step, the buffer oxide film is removed, followed by forming a gate oxide film 8 consisting of a silicon oxide film in a thickness of 2.5 nm to 6.0 nm by a thermal oxidation method or an LPCVD method. Then, a polycrystalline silicon film 10 forming a gate electrode is formed on the gate insulating film 8 by an LPCVD method in a thickness of 200 nm, followed by forming a silicon oxide film 26 acting as a protective film of the gate electrode by, for example, an LPCVD method in a thickness of 30 nm.

Further, the silicon oxide film 26 is coated with a photoresist film, followed by patterning the photoresist film by a photolithography method, an X-ray lithography method or an electron beam exposing method, followed by etching the silicon oxide film 26 and the polycrystalline silicon film 10 by a reactive ion etching (RIE) method so as to form a gate electrode.

Still further, shallow diffusion layers 16, 28 acting as source and drain regions are formed by an ion implantation method so as to prepare the structure shown in FIG. 7. The ion implantation is carried out under the ordinary conditions. For example, for forming the shallow diffusion layer 16, BF$_2^+$ ions are implanted under an accelerating energy of 10 keV and at a dose of $5.0\times10^{14}$ cm$^{-2}$. On the other hand, for forming the shallow diffusion layer 28, arsenic ions (As$^+$) are implanted under an accelerating energy of 15 keV and at a dose of $5.0\times10^{14}$ cm$^{-2}$.

Figure 8:
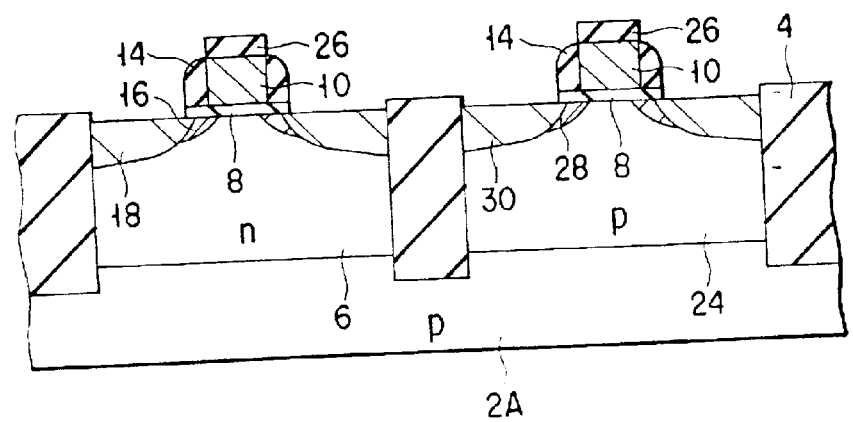
FIG. 8 is a cross sectional view showing another step included in a method of manufacturing a semiconductor device having a salicide structure shown in FIG. 4 according to a second embodiment of the present invention.

In the next step, a silicon nitride film is deposited on the entire surface of the p-type silicon semiconductor substrate 2A by an LPCVD method, followed by anisotropically etching the silicon nitride film by a RIE method so as to form a gate side wall film 14 on the side surfaces of the gate electrode, as shown in FIG. 8. Then, deep diffusion layers 18 and 30 are formed by an ion implantation method within the n-type well 6 and the p-type well 24, respectively. The ion implantation is carried out under the ordinary conditions. For example, for forming the deep diffusion layer 18, BF$_2^+$ ions are implanted under an accelerating energy of 30 keV and at a dose of $4.0\times10^{15}$ cm$^{-2}$. On the other hand, for forming the shallow diffusion layer 30, arsenic ions (As$^+$) are implanted under an accelerating energy of 50 keV and at a dose of $4.0\times10^{15}$ cm$^{-2}$.

In the ion implantation step, the polycrystalline silicon film 10 acting as the gate electrode is also doped with impurities through the silicon oxide film 26. Therefore, the doped impurities are activated by applying an activating annealing treatment by RTA, with the result that each of the deep diffusion layers 18, 30 and the polycrystalline silicon film 10 forming the gate electrode is allowed to have an impurity concentration of at least $1.0\times10^{20}$ cm$^{-3}$. FIG. 8 shows the structure after the ion implantation step for forming the deep diffusion layers 18 and 30.

In the next step, fluorine ions are implanted under a low accelerating energy into surface regions 18a and 30a of the deep diffusion layers 18 and 30, respectively. In this step, it is possible to implant nitrogen ions or oxygen ions in place of the fluorine ions. The ion implantation is carried out under an accelerating energy of 3 to 50 keV and at a dose of about $1.0\times10^{14}$ to $1.0\times10^{15}$ cm$^{-2}$. It should be noted that the gate oxide film 8 positioned on the deep diffusion layers 18, 30 is removed or rendered markedly thin by the anisotropic etching in the step of forming the gate side wall film 14, with the result that the fluorine ion implantation for forming the surface regions 18a, 30a is not inhibited by the gate oxide-film 8. On the other hand, the fluorine ions are not implanted into the polycrystalline silicon film 10 forming the gate electrode because the polycrystalline silicon film 10 is covered with the silicon oxide film 26.

Figure 9:
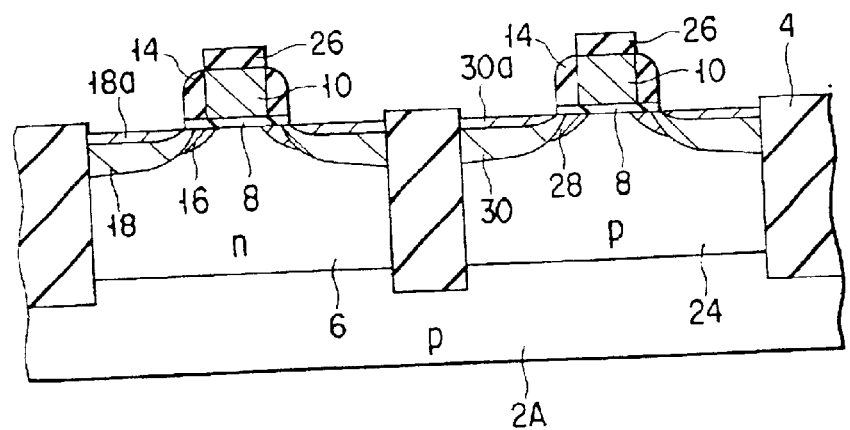
FIG. 9 is a cross sectional view showing another step included in a method of manufacturing a semiconductor device having a salicide structure shown in FIG. 4 according to a second embodiment of the present invention.

It is known to the art that fluorine, nitrogen and oxygen atoms contained in a silicon layer inhibit the silicidation of the silicon layer. It follows that the fluorine, nitrogen or oxygen atoms implanted into the surface regions 18a, 30a of the deep diffusion layers 18, 30 serve to retard the formation of a silicide film formed in the subsequent step in the surface region 18a of the deep diffusion layer 18 and in the surface region 30a of the deep diffusion layer 30. FIG. 9 shows the structure after formation of the surface regions 18a and 30a of the deep diffusion layers 18 and 30, respectively.

Figure 10:
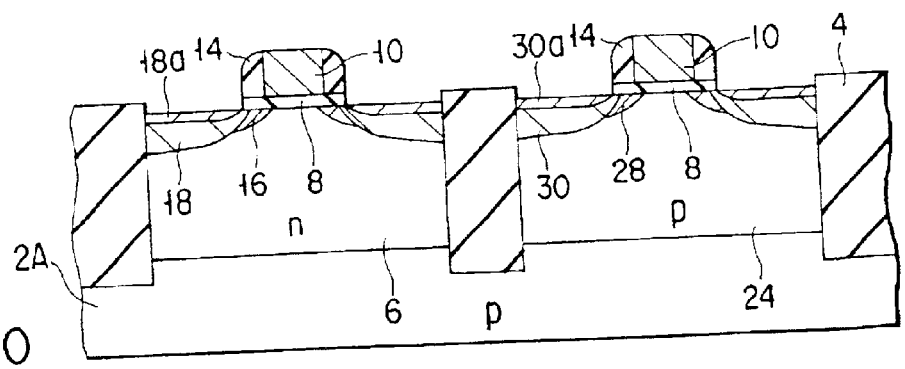
FIG. 10 is a cross sectional view showing another step included in a method of manufacturing a semiconductor device having a salicide structure shown in FIG. 4 according to a second embodiment of the present invention.
Figure 11:
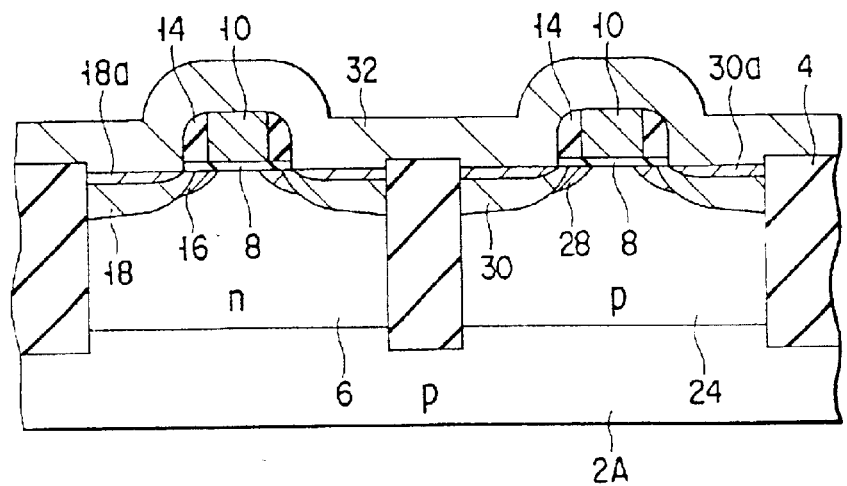
FIG. 11 is a cross sectional view showing another step included in a method of manufacturing a semiconductor device having a salicide structure shown in FIG. 4 according to a second embodiment of the present invention.
Figure 12:
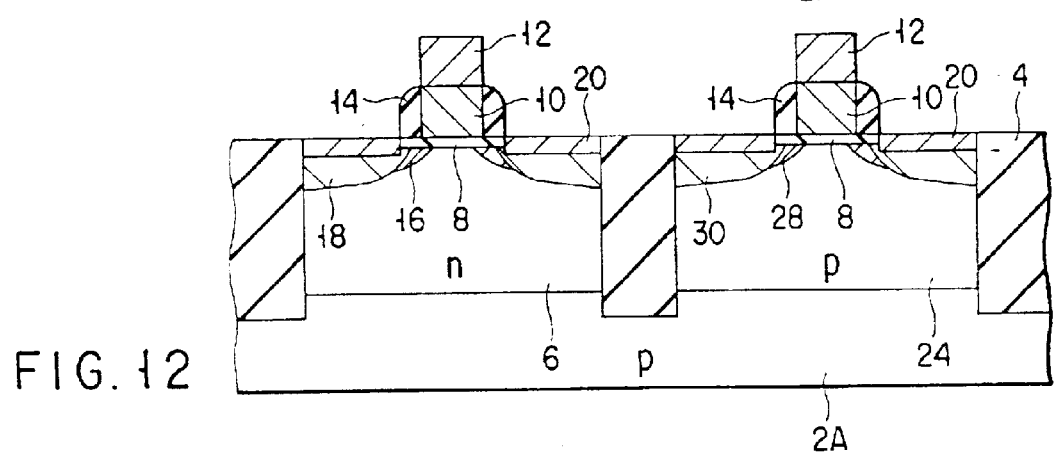
FIG. 12 is a cross sectional view showing still another step included in a method of manufacturing a semiconductor device having a salicide structure shown in FIG. 4 according to a second embodiment of the present invention.

In the next step, the silicon oxide film 26 acting as a protective film of the gate electrode is removed by a wet etching method, as shown in FIG. 10. Then, a titanium layer 32 is formed in a thickness of 40 nm on the entire surface by a sputtering method, as shown in FIG. 11, followed by applying a heat treatment by RTA at 700° C. for 30 seconds. By this heat treatment, the titanium layer positioned on the polycrystalline silicon film 10 acting as a gate electrode and on the deep diffusion layers 18 and 30 is converted into a titanium silicide layer. Then, the unreacted titanium is selectively removed by a treatment with a mixed solution consisting of sulfuric acid and hydrogen peroxide, as shown in FIG. 12, followed by applying a heat treatment by RTA at 850° C. for 20 seconds. As a result, titanium silicide films 12 and 20 are formed selectively on the polycrystalline silicon film 10 acting as a gate electrode and in the surface regions 18a, 30a of the deep diffusion layers 18, 30, respectively.

As described previously, fluorine atoms inhibiting the silicidation of a metal are contained in the surface regions 18a and 30a of the deep diffusion layers 18 and 30, respectively, so as to lower the forming rate of the titanium silicide film 20 in the surface regions 18a and 30a. On the other hand, silicidation of the titanium layer positioned on the polycrystalline silicon film 10 is not retarded and, thus, the titanium silicide film 12 is formed at an ordinary forming rate on the polycrystalline silicon film 10. It follows that the titanium silicide film 12 positioned on the polycrystalline silicon film 10 is allowed to have a thickness at least 1.2 times as much as the thickness of the titanium silicide film 20 positioned on the deep diffusion layers 18, 30.

The semiconductor device having a salicide structure according to the first embodiment of the present invention, which is shown in FIG. 4, can be prepared by the steps described above. Incidentally, the ordinary manufacturing process of a MOS-FET can be employed in the subsequent steps of manufacturing the semiconductor device.

As described above, in the second embodiment of the present invention, atoms inhibiting the silicidation are implanted selectively into the surface regions of the source-drain diffusion layers alone so as to retard formation of the silicide film on the source-drain diffusion layers, making it possible to prepare a semiconductor device of a salicide structure in which the silicide film positioned on the source-drain diffusion layers is thinner than the silicide film positioned on the gate electrode. As described previously, it is important in the present invention that the silicide film positioned on the gate electrode be at least 1.2 times as thick as the silicide film positioned on the source-drain diffusion layers.

In the second embodiment described above, each of the silicide film 12 included in the gate electrode and the silicide film 20 positioned on the source-drain diffusion layers consists of titanium silicide. However, these silicide films need not be limited to titanium silicide films. Specifically, it is possible for these silicide films to consist of a silicide of a metal having a high melting point such as cobalt or nickel.

Also, the gate insulating film 8 consists of a silicon oxide film in the second embodiment described above. However, another insulating film such as a silicon nitride film or a silicon oxynitride film can be used in place of the silicon oxide film for forming the gate insulating film 8. Further, a p-type silicon semiconductor substrate is used in the second embodiment described above. However, it is also possible to use an n-type silicon semiconductor substrate.

Third Embodiment

The third embodiment of the present invention is directed to the manufacture of a semiconductor device having a salicide structure shown in FIG. 6, which is a modification of the semiconductor device according to the first embodiment of the present invention. In the third embodiment, the silicide films 12 and 20 consist of titanium silicide films as in the second embodiment. Also, the silicon semiconductor substrate 2A used in the third embodiment is of p-type conductivity.

FIGS. 13 to 18 are cross sectional views collectively showing a method of manufacturing a semiconductor device according to the third embodiment of the present invention. The third embodiment is directed to the manufacture of a semiconductor device having a salicide structure shown in FIG. 6, which is a modification of the semiconductor device according to the first embodiment of the present invention.

Figure 13:
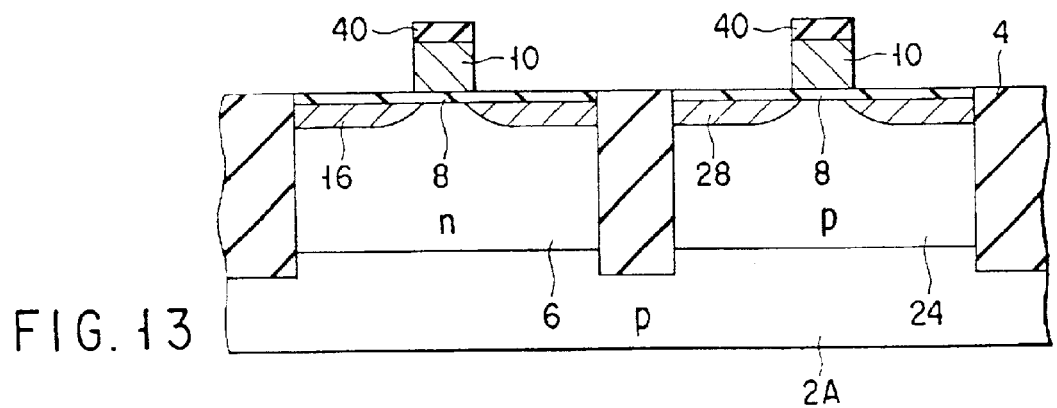
FIG. 13 is a cross sectional view showing a step included in a method of manufacturing a semiconductor device having a salicide structure shown in FIG. 6 according to a third embodiment of the present invention.

In the first step, an element isolation region 4 is formed as in the second embodiment on a p-type silicon semiconductor substrate 2A in a depth of about 300 nm by a buried element separation method as shown in FIG. 13. Then, a buffer oxide film is formed in a thickness of about 10 nm on the surface of the p-type silicon semiconductor substrate 2A in the element forming region positioned between the two adjacent element isolating regions 4.

After formation of the buffer oxide film, an n-type well 6, a p-type well 24 and a channel region are formed by ion implantation in the element forming region on the p-type silicon semiconductor substrate 2A. The ion implantation is carried out under the ordinary conditions as in the second embodiment. Then, the buffer oxide film is removed, followed by forming a gate insulating film 8 consisting of a silicon oxide film having a thickness of 2.5 nm to 6.0 nm by a thermal oxidation method or an LPCVD method. Further, a polycrystalline silicon film 10 acting as a gate electrode is formed by an LPCVD method on the gate insulating film 8, followed by forming a silicon nitride film 40 serving to protect the gate electrode in a thickness of 30 nm by, for example, an LPCVD method.

The silicon nitride film 40 thus formed is coated with a photoresist film, followed by patterning the photoresist film by a photolithography method, an X-ray lithography method or an electron beam exposing method. Then, the silicon nitride film 40 and the polycrystalline silicon film 10 are etched by means of a reactive ion etching (RIE) method so as to form a gate electrode.

After formation of the gate electrode, shallow diffusion layers 16 and 28 acting as source-drain regions are formed by an ion implantation method in the n-type well 6 and the p-type well 24, respectively. The ion implantation is carried out under the ordinary conditions, as in the second embodiment. FIG. 13 shows the resultant structure.

Figure 14:
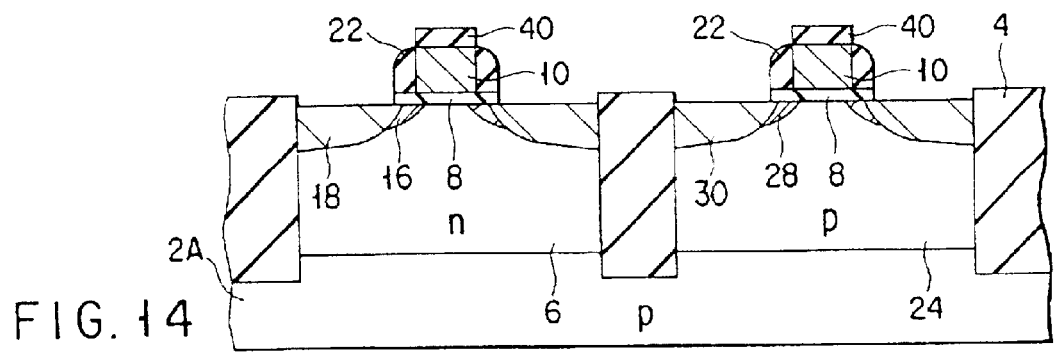
FIG. 14 is a cross sectional view showing another step included in a method of manufacturing a semiconductor device having a salicide structure shown in FIG. 6 according to a third embodiment of the present invention.

In the next step, a silicon oxide film is deposited on the entire surface of the p-type silicon semiconductor substrate 2A by an LPCVD method, followed by applying an anisotropic etching to the silicon oxide film by means of a RIE method so as to form a gate side wall film 22 on the side surfaces of the gate electrode, as shown in FIG. 14. Then, deep diffusion layers 18 and 30 acting as source-drain regions are formed by an ion implantation method in the n-type well 6 and the p-type well 24, respectively. The ion implantation is carried out under the ordinary conditions, as in the second embodiment.

It should be noted that the polycrystalline silicon film 10 acting as a gate electrode is also doped with the impurities through the silicon nitride film 40 in the ion implantation step for forming the deep diffusion layers 18 and 30. Therefore, the doped impurities are activated by an activating annealing treatment by RTA, with the result that each of the deep diffusion layers 18, 30 and the polycrystalline silicon film 10 acting as a gate electrode is allowed to have an impurity concentration of at least $1.0 \times 10^{20}$ cm$^{-3}$. FIG. 14 shows the resultant structure.

Figure 15:
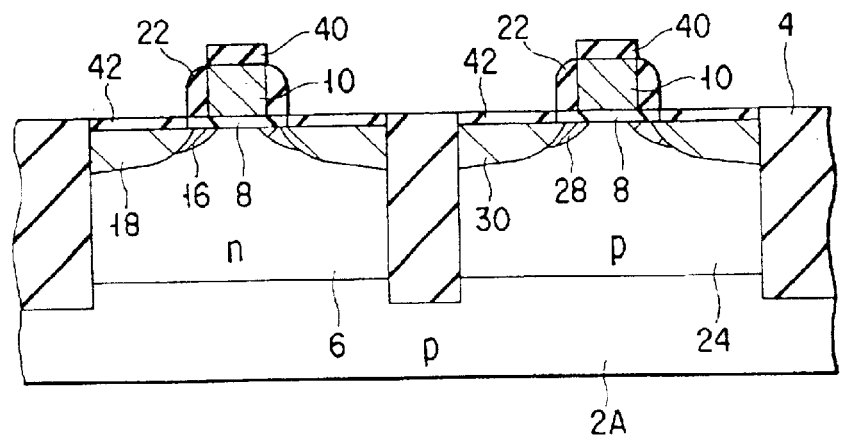
FIG. 15 is a cross sectional view showing another step included in a method of manufacturing a semiconductor device having a salicide structure shown in FIG. 6 according to a third embodiment of the present invention.
Figure 16:
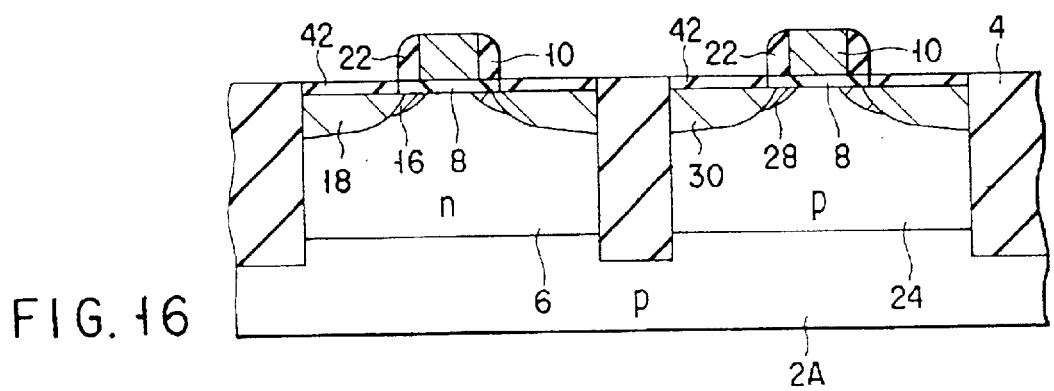
FIG. 16 is a cross sectional view showing another step included in a method of manufacturing a semiconductor device having a salicide structure shown in FIG. 6 according to a third embodiment of the present invention.

In the next step, a silicon oxide film 42 is formed in a thickness of 3.0 nm to 5.0 nm on the deep diffusion layers 18 and 30 by a thermal oxidation method or a chemical oxidation method, as shown in FIG. 15. Then, the silicon nitride film 40 serving to protect the gate electrode is removed by a wet etching using, for example, as hot phosphoric acid, as shown in FIG. 16. Under this condition, only traces of a native oxide film alone is present on the polycrystalline silicon film 10 acting as a gate electrode. On the other hand, the silicon oxide film 42 is left unremoved on the diffusion layers 18 and 30.

Figure 17:
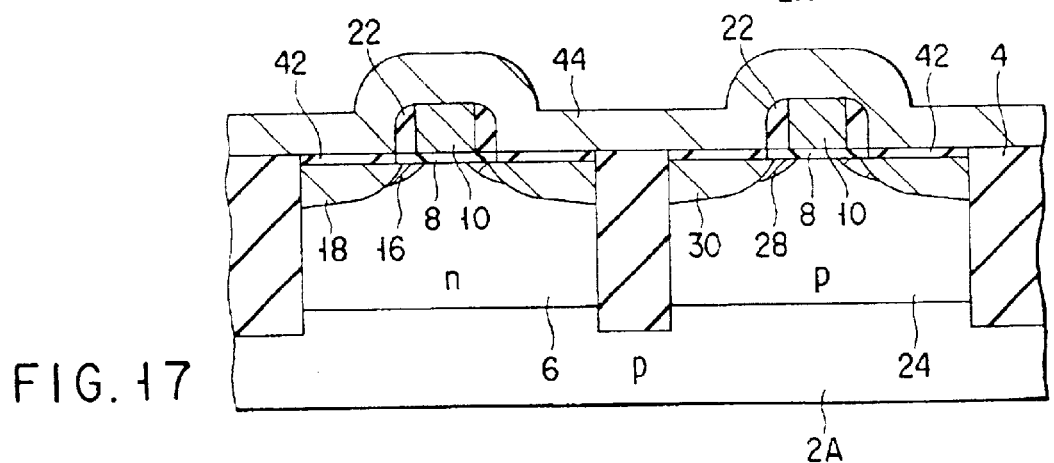
FIG. 17 is a cross sectional view showing another step included in a method of manufacturing a semiconductor device having a salicide structure shown in FIG. 6 according to a third embodiment of the present invention.
Figure 18:
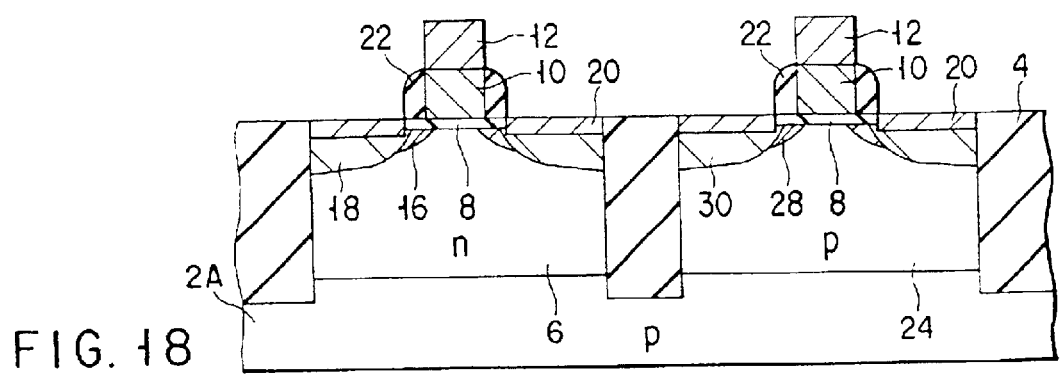
FIG. 18 is a cross sectional view showing a still another step included in a method of manufacturing a semiconductor device having a salicide structure shown in FIG. 6 according to a third embodiment of the present invention.

Further, a titanium layer 44 is deposited in a thickness of 40 nm by a sputtering method on the entire surface, as shown in FIG. 17, followed by applying a heat treatment by RTA at 700° C. for 30 seconds. By this heat treatment, the titanium layer positioned on the polycrystalline silicon film 10 acting as a gate electrode and on the deep diffusion layers 18 and 30 is converted into a titanium silicide film. Then, the unreacted titanium layer is selectively removed by a selective removing method using a mixed solution consisting of sulfuric acid and hydrogen peroxide, as shown in FIG. 18, followed by applying a heat treatment by RTA at 850° C. for 20 seconds. As a result, titanium silicide films 12 and 20 are selectively formed on the polycrystalline silicon film 10 acting as a gate electrode and on the deep diffusion layers 18, 30 alone, respectively.

As described above, the thick silicon oxide film 42 is formed on the deep diffusion layers 18 and 30, with the result that the titanium layer 44 is consumed to some extent for the reduction of oxygen contained in the silicon oxide film 42. It follows that the titanium silicide film 20 is formed at a low rate on the deep diffusion layers 18 and 30. On the other hand, silicidation of the titanium layer 44 positioned on the polycrystalline silicon layer 10 is not inhibited, with the result that the titanium silicide film 12 is formed at an ordinary rate. In conclusion, the titanium silicide film 12 formed on the polycrystalline silicon film 10 is allowed to have a thickness at least 1.2 times as much as the thickness of the titanium silicide film 20 formed on the deep diffusion layers 18 and 30.

The semiconductor device having a salicide structure shown in FIG. 6, which is a modification of the semiconductor device according to the first embodiment, is prepared by the steps described above. Incidentally, the ordinary manufacturing process of a MOS-FET can be employed in the subsequent steps of manufacturing the semiconductor device.

As described above, according to the third embodiment of the present invention, an oxide film is selectively formed on the source-drain diffusion layers alone. As a result, the titanium layer positioned on the oxide film is partly consumed for reduction of oxygen contained in the oxide film so as to retard formation of the titanium silicide film on the source-drain diffusion layers. It follows that it is possible to prepare a semiconductor device of a salicide structure, in which the silicide film formed on the gate electrode is thicker than the silicide film formed on the source-drain diffusion layers. It should be noted that the silicide film formed on the gate electrode is at least 1.2 times as thick as the silicide film formed on the source-drain diffusion layers.

By contraries, it is possible to form a silicon oxide film on the polycrystalline silicon film 10 acting as a gate electrode and to use a silicon nitride film for forming the gate side wall film 22. In this case, the silicon oxide film formed on the polycrystalline silicon film 10 is removed by a wet etching after formation of a silicon nitride film on the deep diffusion layers 18 and 30 so as to use the silicon nitride film on the deep diffusion layers 18 and 30 as a film for inhibiting the silicidation of the titanium layer.

In the third embodiment described above, each of the silicide film 12 included in the gate electrode and the silicide film 20 positioned on the source-drain diffusion layers consists of titanium silicide. However, these silicide films need not be limited to titanium silicide films. Specifically, it is possible for these silicide films to consist of a silicide of a metal having a high melting point such as cobalt or nickel.

Also, the gate insulating film 8 consists of a silicon oxide film in the third embodiment described above. However, another insulating film such as a silicon nitride film or a silicon oxynitride film can be used in place of the silicon oxide film for forming the gate insulating film 8. Further, a p-type silicon semiconductor substrate is used in the second embodiment described above. However, it is also possible to use an n-type silicon semiconductor substrate.

Fourth Embodiment

The fourth embodiment of the present invention is directed to the manufacture of a semiconductor device having a salicide structure shown in FIG. 4, which is a semiconductor device according to the first embodiment of the present invention. In the fourth embodiment, the silicide films 12 and 20 consist of titanium silicide films as in the second embodiment. Also, the silicon semiconductor substrate 2A used in the fourth embodiment is of p-type conductivity.

FIGS. 19 to 24 are cross sectional views collectively showing a method of manufacturing a semiconductor device according to the fourth embodiment of the present invention. The fourth embodiment is directed to the manufacture of a semiconductor device having a salicide structure shown in FIG. 4, which is a semiconductor device according to the first embodiment of the present invention.

Figure 19:
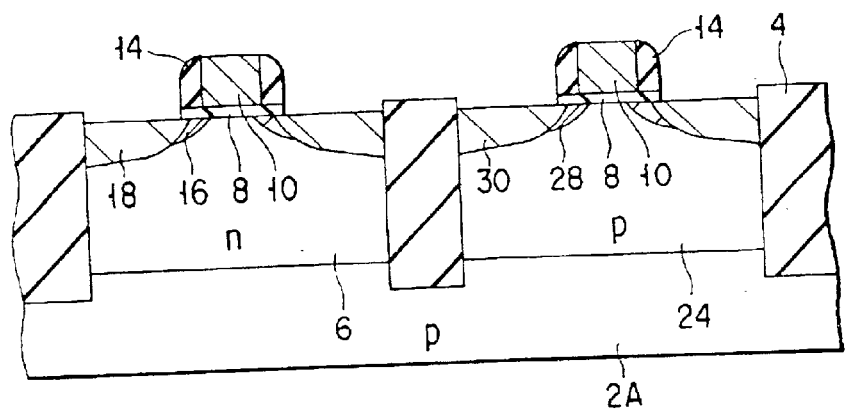
FIG. 19 is a cross sectional view showing a step included in a method of manufacturing a semiconductor device having a salicide structure shown in FIG. 4 according to a fourth embodiment of the present invention.

In the first step, an element isolation region 4 is formed as in the second embodiment on a p-type silicon semiconductor substrate 2A in a depth of about 300 nm by a buried element separation method as shown in FIG. 19. Then, a buffer oxide film is formed in a thickness of about 10 nm on the surface of the p-type silicon semiconductor substrate 2A in the element forming region positioned between the two adjacent element isolating regions 4.

After formation of the buffer oxide film, an n-type well 6, a p-type well 24 and channel regions are formed by ion implantation in the element forming region on the p-type silicon semiconductor substrate 2A. The ion implantation is carried out under the ordinary conditions as in the second embodiment. Then, the buffer oxide film is removed, followed by forming a gate insulating film 8 consisting of a silicon oxide film having a thickness of 2.5 nm to 6.0 nm by a thermal oxidation method or an LPCVD method. Further, a polycrystalline silicon film 10 acting as a gate electrode is formed in a thickness of 200 nm by an LPCVD method on the gate insulating film 8.

The polycrystalline silicon film 10 thus formed is coated with a photoresist film, followed by patterning the photoresist film by a photolithography method, an X-ray lithography method or an electron beam exposing method. Then, the polycrystalline silicon film 10 is etched by means of a reactive ion etching (RIE) method so as to form a gate electrode.

After formation of the gate electrode, shallow diffusion layers 16 and 28 acting as source-drain regions are formed by an ion implantation method in the n-type well 6 and the p-type well 24, respectively. The ion implantation is carried out under the ordinary conditions, as in the second embodiment.

In the next step, a silicon nitride film-is deposited on the entire surface of the p-type silicon semiconductor substrate 2A by an LPCVD method, followed by applying an anisotropic etching to the silicon nitride film by means of a RIE method so as to form a gate side wall film 14 on the side surfaces of the gate electrode. Then, deep diffusion layers 18 and 30 acting as source-drain regions are formed by an ion implantation method in the n-type well 6 and the p-type well 24, respectively. The ion implantation is carried out under the ordinary conditions, as in the second embodiment.

It should be noted that the ion implantation is applied directly to the polycrystalline silicon film 10 acting as a gate electrode with the result that the polycrystalline silicon film 10 is doped with a high concentration of impurities. Therefore, the doped impurities are activated by an activating annealing treatment by RTA, with the result that each of the deep diffusion layers 18, 30 and the polycrystalline silicon film 10 acting as a gate electrode is allowed to have an impurity concentration of at least $1.0 \times 10^{20}$ cm$^{-3}$. FIG. 19 shows the resultant structure.

Figure 20:
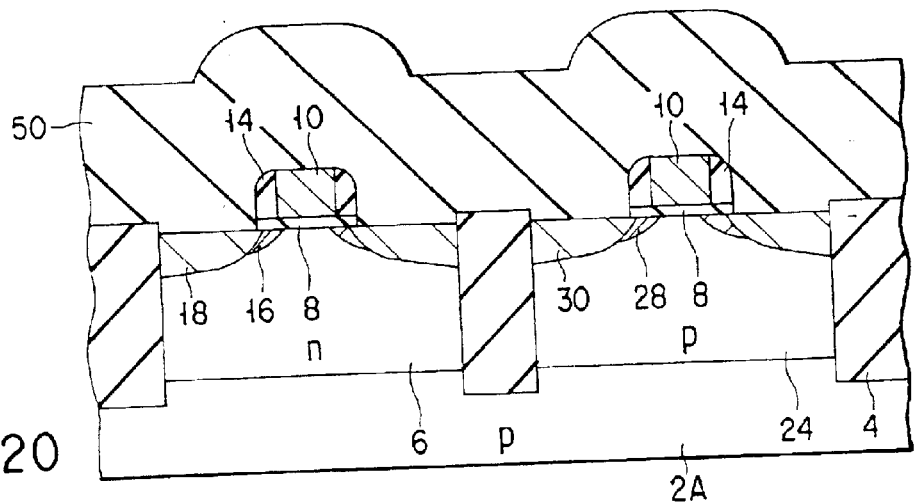
FIG. 20 is a cross sectional view showing another step included in a method of manufacturing a semiconductor device having a salicide structure shown in FIG. 4 according to a fourth embodiment of the present invention.
Figure 21:
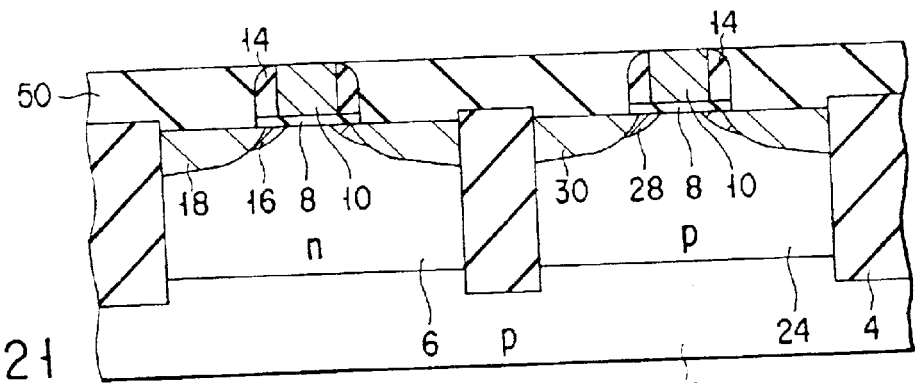
FIG. 21 is a cross sectional view showing another step included in a method of manufacturing a semiconductor device having a salicide structure shown in FIG. 4 according to a fourth embodiment of the present invention.

In the next step, an insulating film 50 consisting of, for example, BPSG is formed on the entire surface by an LPCVD method in a thickness of about 600 nm, as shown in FIG. 20. Then, the surface of the insulating film 50 is flattened by a CMP (chemical mechanical polishing) method, followed by carrying out an etching back by a CMP method or a RIE method with the polycrystalline silicon film 10 used as a stopper. As a result, the surface of the polycrystalline silicon film 10 is selectively exposed to the surface, as shown in FIG. 21.

Figure 22:
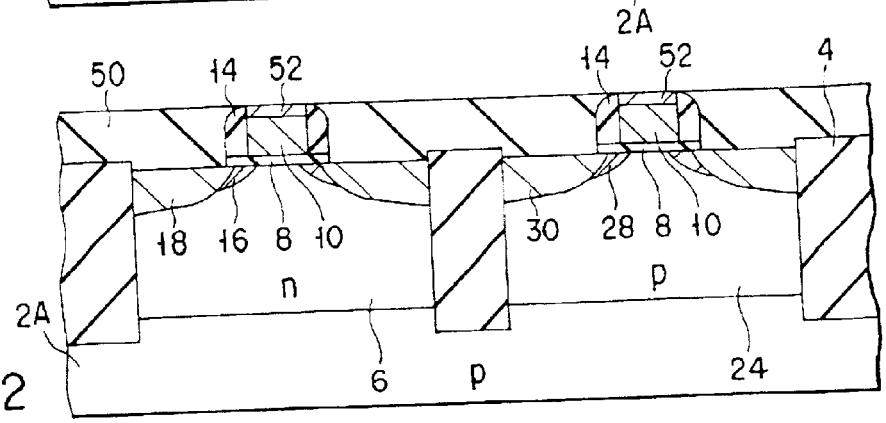
FIG. 22 is a cross sectional view showing another step included in a method of manufacturing a semiconductor device having a salicide structure shown in FIG. 4 according to a fourth embodiment of the present invention.

In the next step, germanium ions are selectively implanted into a surface region of the polycrystalline silicon film 10 acting as a gate electrode by an ion implantation method which is carried out under a low accelerating energy, as shown in FIG. 22. Incidentally, ions of boron, silicon, arsenic or antimony can be implanted in place of the germanium ions. The ion implantation in this step is carried out under an accelerating energy of 3 to 50 keV and at a dose of about $1.0 \times 10^{14}$ to $1.0 \times 10^{15}$ cm$^{-2}$. As a result, the surface region of the polycrystalline silicon film 10 is rendered amorphous to form an amorphous layer 52. It should be noted that the region other than the polycrystalline silicon film 10 is covered with the insulating film 50 and, thus, the germanium ions are not implanted into the particular region.

It is known to the art that silicidation of a metal is promoted in the case where the silicon layer has an amorphous surface. It follows that the amorphous surface layer 52 formed on the polycrystalline silicon film 10 acting as a gate electrode permits promoting the formation of a silicide film on the polycrystalline silicon film 10 in the subsequent step. FIG. 22 shows the resultant structure of the semiconductor device.

Figure 23:
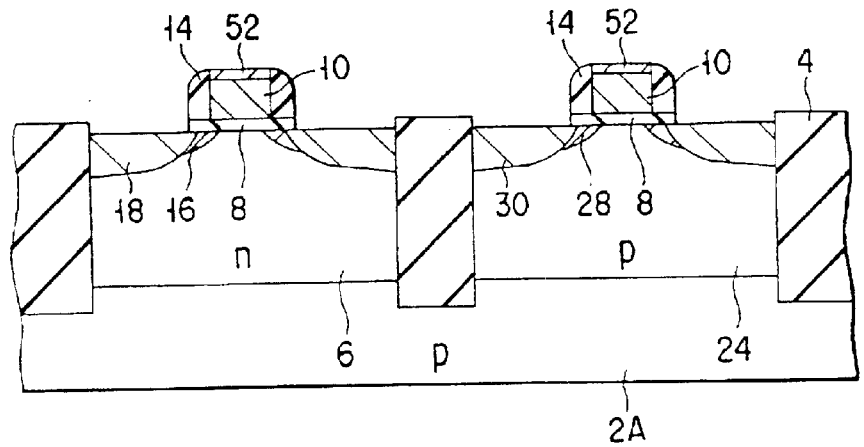
FIG. 23 is a cross sectional view showing another step included in a method of manufacturing a semiconductor device having a salicide structure shown in FIG. 4 according to a fourth embodiment of the present invention.
Figure 24:
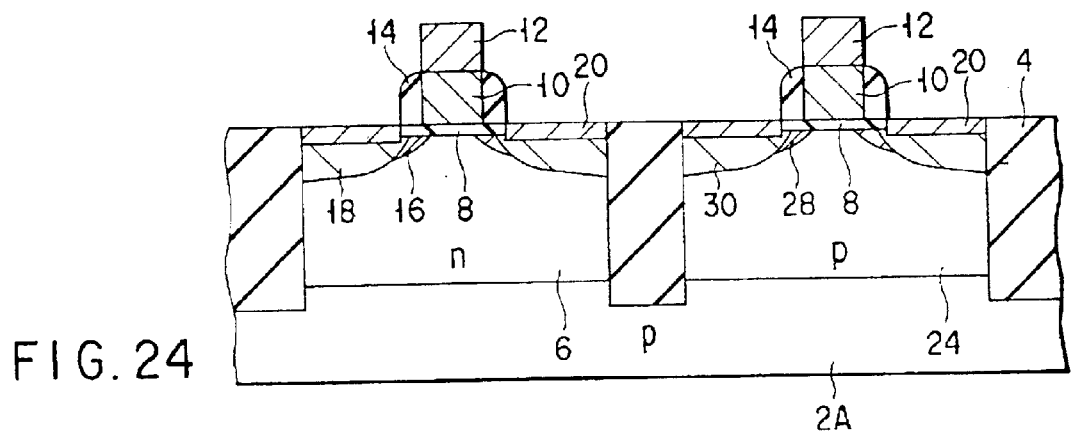
FIG. 24 is a cross sectional view showing still another step included in a method of manufacturing a semiconductor device having a salicide structure shown in FIG. 4 according to a fourth embodiment of the present invention.

The insulating film 50 is removed in the subsequent step by a wet etching using ammonium fluoride, as shown in FIG. 23. It should be noted that, after formation of the amorphous surface layer 52, a heat treatment is not applied, with the result that the surface region of the polycrystalline silicon film 10 is held amorphous.

In the next step, a titanium layer is deposited by a sputtering method in a thickness of 40 nm on entire surface including the polycrystalline silicon film 10, followed by applying a heat treatment by RTA at 700° C. for 30 seconds. By this heat treatment, the titanium layer positioned on the polycrystalline silicon film 10 acting as a gate electrode and on the deep diffusion layers 18 and 30 is converted into a titanium silicide film. Then, the unreacted titanium layer is selectively removed by a selective removing method using a mixed solution consisting of sulfuric acid and hydrogen peroxide, followed by applying a heat treatment by RTA at 850° C. for 20 seconds. As a result, titanium silicide films 12 and 20 are formed selectively on the polycrystalline silicon film 10 acting as a gate electrode and on the deep diffusion layers 18, 30, respectively.

It should be noted that the polycrystalline silicon film 10 acting as a gate electrode includes the amorphous surface layer 52, as described previously, so as to promote the formation of the titanium silicide film 12 on the polycrystalline silicon film 10. On the other hand, the silicidation of the titanium layer positioned on the deep diffusion layers 18 and 30 is not particularly promoted. In other words, the titanium silicide film 20 positioned on the deep diffusion layers 18 and 30 is formed at an ordinary rate. It follows that the titanium silicide film 12 positioned on the polycrystalline silicon film 10 is made at least 1.2 times as thick as the titanium silicide film 20 positioned on the deep diffusion layers 18, 20.

The semiconductor device having a salicide structure shown in FIG. 4, which is a semiconductor device according to the first embodiment, is prepared by the steps described above. Incidentally, the ordinary manufacturing process of a MOS-FET can be employed in the subsequent steps of manufacturing the semiconductor device.

As described above, according to the fourth embodiment of the present invention, an amorous layer is formed selectively in the upper surface region of the polycrystalline silicon film 10 acting as a gate electrode so as to promote the silicidation on the gate electrode alone. As a result, it is possible to prepare a semiconductor device of a salicide structure, in which the silicide film formed on the gate electrode is thicker than the silicide film formed on the source-drain diffusion layers. To be more specific, the silicide film formed on the gate electrode is at least 1.2 times as thick as the silicide film formed on the source-drain diffusion layers.

In the fourth embodiment described above, each of the silicide film 12 included in the gate electrode and the silicide film 20 positioned on the source-drain diffusion layers consists of titanium silicide. However, these silicide films need not be limited to titanium silicide films. Specifically, it is possible for these silicide films to consist of a silicide of a metal having a high melting point such as cobalt or nickel.

Also, the gate insulating film 8 consists of a silicon oxide film in the fourth embodiment described above. However, another insulating film such as a silicon nitride film or a silicon oxynitride film can be used in place of the silicon oxide film for forming the gate insulating film 8. Further, a p-type silicon semiconductor substrate is used in the second embodiment described above. However, it is also possible to use an n-type silicon semiconductor substrate.

Fifth Embodiment

The fifth embodiment of the present invention is directed to the manufacture of a semiconductor device having a salicide structure shown in FIG. 4, which is a semiconductor device according to the first embodiment of the present invention. In the fifth embodiment, the silicide films 12 and 20 consist of titanium silicide films as in the second embodiment. Also, the silicon semiconductor substrate 2A used in the fifth embodiment is of p-type conductivity.

Figure 25:
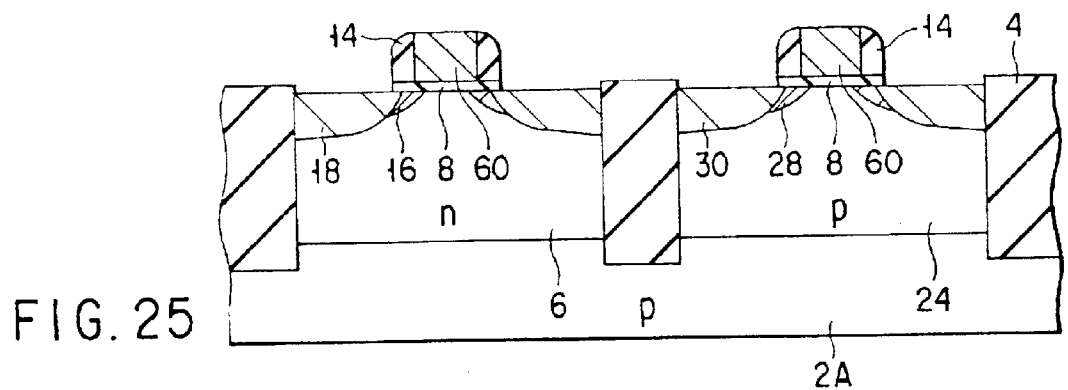
FIG. 25 is a cross sectional view showing a step included in a method of manufacturing a semiconductor device having a salicide structure shown in FIG. 4 according to a fifth embodiment of the present invention.
Figure 26:
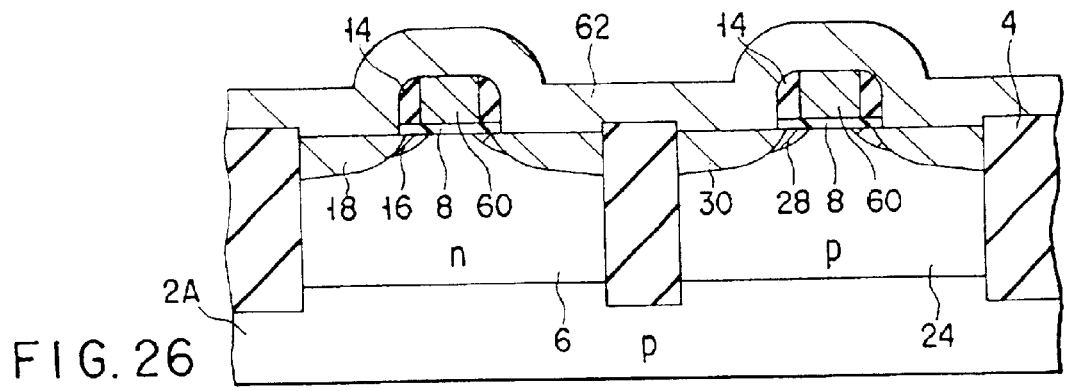
FIG. 26 is a cross sectional view showing another step included in a method of manufacturing a semiconductor device having a salicide structure shown in FIG. 4 according to a fifth embodiment of the present invention.
Figure 27:
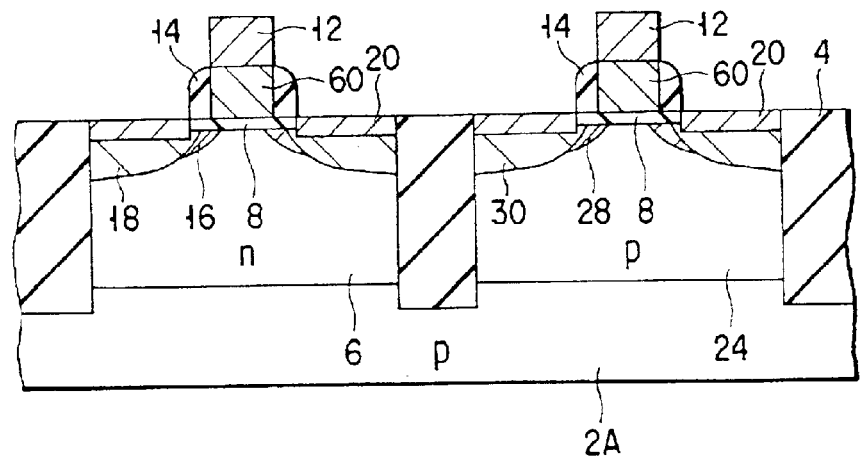
FIG. 27 is a cross sectional view showing still another step included in a method of manufacturing a semiconductor device having a salicide structure shown in FIG. 4 according to a fifth embodiment of the present invention.

FIGS. 25 to 27 are cross sectional views collectively showing a method of manufacturing a semiconductor device according to the fifth embodiment of the present invention. The fifth embodiment is directed to the manufacture of a semiconductor device having a salicide structure shown in FIG. 4, which is a semiconductor device according to the first embodiment of the present invention.

In the first step, an element isolation region 4 is formed as in the second embodiment on a p-type silicon semiconductor substrate 2A in a depth of about 300 nm by a buried element separation method as shown in FIG. 25. Then, a buffer oxide film is formed in a thickness of about 10 nm on the surface of the p-type silicon semiconductor substrate 2A in the element forming region positioned between the two adjacent element isolating regions 4.

After formation of the buffer oxide film, an n-type well 6, a p-type well 24 and channel regions are formed by ion implantation in the element forming region on the p-type silicon semiconductor substrate 2A. The ion implantation is carried out under the ordinary conditions as in the second embodiment. Then, the buffer oxide film is removed, followed by forming a gate insulating film 8 consisting of a silicon oxide film having a thickness of 2.5 nm to 6.0 nm by a thermal oxidation method or an LPCVD method. Further, an amorphous silicon film 60 acting as a gate electrode is formed in a thickness of 200 nm by an LPCVD method on the gate insulating film 8.

The amorphous silicon film 60 thus formed is coated with a photoresist film, followed by patterning the photoresist film by a photolithography method, an X-ray lithography method or an electron beam exposing method. Then, the amorphous silicon film 60 is etched by means of a reactive ion etching (RIE) method so as to form a gate electrode.

After formation of the gate electrode, shallow diffusion layers 16 and 28 acting as source-drain regions are formed by an ion implantation method in the n-type well 6 and the p-type well 24, respectively. The ion implantation is carried out under the ordinary conditions, as in the second embodiment.

In the next step, a silicon nitride film is deposited on the entire surface of the p-type silicon semiconductor substrate 2A by an LPCVD method, followed by applying an anisotropic etching to the silicon nitride film by means of a RIE method so as to form a gate side wall film 14 on the side surfaces of the amorphous silicon film 60 acting as a gate electrode. Then, deep diffusion layers 18 and 30 acting as source-drain regions are formed by an ion implantation method in the n-type well 6 and the p-type well 24, respectively. The ion implantation is carried out under the ordinary conditions, as in the second embodiment.

It should be noted that, in order to prevent the amorphous silicon film 60 from being converted into a polycrystalline silicon film, a heat treating step should be avoided as much as possible after deposition of the amorphous silicon layer 60. FIG. 25 shows the resultant structure of the semiconductor device.

In the next step, a titanium layer 62 is deposited by a sputtering method in a thickness of 40 nm on entire surface including the amorphous silicon film 60, followed by applying a heat treatment by RTA at 700° C. for 30 seconds. By this heat treatment, the titanium layer positioned on the amorphous silicon film 60 acting as a gate electrode and on the deep diffusion layers 18 and 30 is converted into a titanium silicide film. Then, the unreacted titanium layer is selectively removed by a selective removing method using a mixed solution consisting of sulfuric acid and hydrogen peroxide, followed by applying a heat treatment by RTA at 850° C. for 20 seconds. As a result, titanium silicide films 12 and 20 are formed selectively on the amorphous silicon film 60 acting as a gate electrode and on the deep diffusion layers 18, 30, respectively. It should be noted that, by the second heat treatment by RTA, the amorphous silicon film 60 is converted into a polycrystalline silicon film, and the dopant contained in the deep diffusion layers 18 and 30 is activated.

It should be noted that, since the gate electrode is formed of the amorphous silicon film 60 as described above, the titanium silicide film 12 is formed at a high rate on the gate electrode consisting of the amorphous silicon film 60. On the other hand, the silicidation of the titanium layer positioned on the deep diffusion layers 18 and 30 is not promoted, with the result that the titanium silicide film 20 is formed at an ordinary rate. It follows that the titanium silicide film 12 positioned on the amorphous silicon film 60 is made at least 1.2 times as thick as the titanium silicide film 20 positioned on the deep diffusion layers 18 and 30.

The semiconductor device having a salicide structure shown in FIG. 4, which is a semiconductor device according to the first embodiment, is prepared by the steps described above. Incidentally, the ordinary manufacturing process of a MOS-FET can be employed in the subsequent steps of manufacturing the semiconductor device.

As described above, according to the fifth embodiment of the present invention, the gate electrode is formed of an amorphous silicon, with the result that the silicidation of the titanium layer positioned on the gate electrode is promoted. It follows that it is possible to manufacture a semiconductor device of a salicide structure, in which the silicide film positioned on the gate electrode is relatively thicker than the silicide film positioned on the source-drain diffusion layers. To be more specific, the silicide film formed on the gate electrode is at least 1.2 times as thick as the silicide film formed on the source-drain diffusion layers.

In the fifth embodiment described above, each of the silicide film 12 included in the gate electrode and the silicide film 20 positioned on the source-drain diffusion layers consists of titanium silicide. However, these silicide films need not be limited to titanium silicide films. Specifically, it is possible for these silicide films to consist of a silicide of a metal having a high melting point such as cobalt or nickel.

Also, the gate insulating film 8 consists of a silicon oxide film in the fifth embodiment described above. However, another insulating film such as a silicon nitride film or a silicon oxynitride film can be used in place of the silicon oxide film for forming the gate insulating film 8. Further, a p-type silicon semiconductor substrate is used in the fifth embodiment described above. However, it is also possible to use an n-type silicon semiconductor substrate.

Sixth Embodiment

The sixth embodiment of the present invention is directed to the manufacture of a semiconductor device having a salicide structure shown in FIG. 4, which is a semiconductor device according to the first embodiment of the present invention. In the sixth embodiment, the silicide films 12 and 20 consist of titanium silicide films as in the second embodiment. Also, the silicon semiconductor substrate 2A used in the sixth embodiment is of p-type conductivity.

FIGS. 28 to 32 are cross sectional views collectively showing a method of manufacturing a semiconductor device according to the sixth embodiment of the present invention. The sixth embodiment is directed to the manufacture of a semiconductor device having a salicide structure shown in FIG. 4, which is a semiconductor device according to the first embodiment of the present invention.

Figure 28:
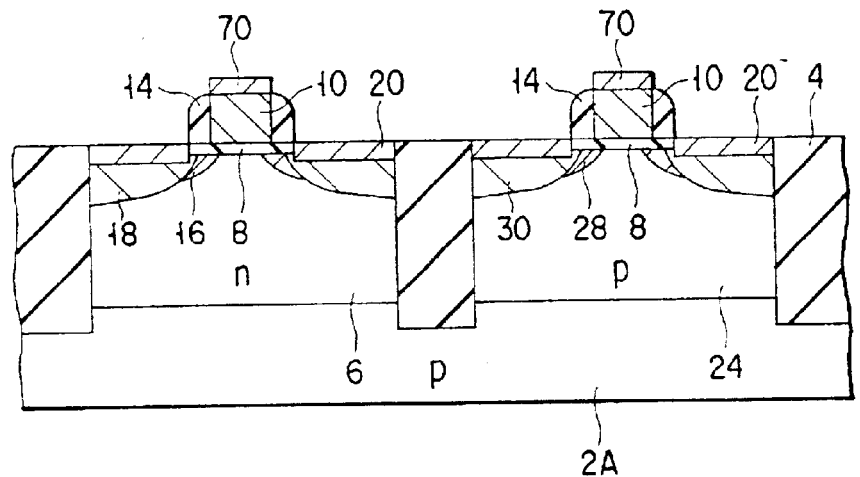
FIG. 28 is a cross sectional view showing a step included in a method of manufacturing a semiconductor device having a salicide structure shown in FIG. 4 according to a sixth embodiment of the present invention.

In the first step, an element isolation region 4 is formed as in the second embodiment on a p-type silicon semiconductor substrate 2A in a depth of about 300 nm by a buried element separation method as shown in FIG. 28. Then, a buffer oxide film is formed in a thickness of about 10 nm on the surface of the p-type silicon semiconductor substrate 2A in the element forming region positioned between the two adjacent element isolating regions 4.

After formation of the buffer oxide film, an n-type well 6, a p-type well 24 and channel regions are formed by ion implantation in the element forming region on the p-type silicon semiconductor substrate 2A. The ion implantation is carried out under the ordinary conditions as in the second embodiment. Then, the buffer oxide film is removed, followed by forming a gate insulating film 8 consisting of a silicon oxide film having a thickness of 2.5 nm to 6.0 nm by a thermal oxidation method or an LPCVD method. Further, a polycrystalline silicon film 10 acting as a gate electrode is formed in a thickness of 200 nm by an LPCVD method on the gate insulating film 8.

The polycrystalline silicon film 10 thus formed is coated with a photoresist film, followed by patterning the photoresist film by a photolithography method, an X-ray lithography method or an electron beam exposing method. Then, the polycrystalline silicon film 10 is etched by means of a reactive ion etching (RIE) method so as to form a gate electrode.

After formation of the gate electrode, shallow diffusion layers 16 and 28 acting as source-drain regions are formed by an ion implantation method in the n-type well 6 and the p-type well 24, respectively. The ion implantation is carried out under the ordinary conditions, as in the second embodiment.

In the next step, a silicon nitride film is deposited on the entire surface of the p-type silicon semiconductor substrate 2A by an LPCVD method, followed by applying an anisotropic etching to the silicon nitride film by means of a RIE method so as to form a gate side wall film 14 on the side surfaces of the amorphous silicon film 60 acting as a gate electrode. Then, deep diffusion layers 18 and 30 acting as source-drain regions are formed by an ion implantation method in the n-type well 6 and the p-type well 24, respectively. The ion implantation is carried out under the ordinary conditions, as in the second embodiment.

It should be noted that impurities ions are implanted directly into the polycrystalline silicon film 10 acting as a gate electrode, with the result that the gate electrode is doped with a high concentration of the impurities. Therefore, the doped impurities are activated by application of an activating annealing treatment by RTA, with the result that each of the deep diffusion layers 18, 30 and the polycrystalline silicon film 10 acting as a gate electrode is allowed to have an impurity concentration of at least $1.0 \times 10^{20}$ cm$^{-3}$.

In the next step, a titanium layer is deposited by a sputtering method in a thickness of 20 to 30 nm on entire surface, followed by applying a heat treatment by RTA at 700° C. for 30 seconds. By this heat treatment, the titanium layer positioned on the polycrystalline silicon film 10 acting as a gate electrode and on the deep diffusion layers 18 and 30 is converted into a titanium silicide film. Then, the unreacted titanium layer is selectively removed by a selective removing method using a mixed solution consisting of sulfuric acid and hydrogen peroxide, followed by applying a heat treatment by RTA at 850° C. for 20 seconds. As a result, titanium silicide films 70 and 20 are formed selectively on the polycrystalline silicon film 10 acting as a gate electrode and on the deep diffusion layers 18, 30, respectively.

The titanium silicide films 70 and 20 substantially equal to each other in thickness are formed on the polycrystalline silicon film 10 acting as a gate electrode and on the deep diffusion layers 18 and 30 by the general manufacturing method of a salicide structure described above. It should be noted, however, that the titanium layer deposited on the polycrystalline silicon film 10 and on the deep diffusion layers 18 and 30 is thinner than that formed in the other embodiments described previously. As a result, the titanium silicide films 70 and 20 formed in the sixth embodiment are thinner than the titanium silicide films formed in the other embodiments described previously. FIG. 28 shows the resultant structure of the semiconductor device.

Figure 29:
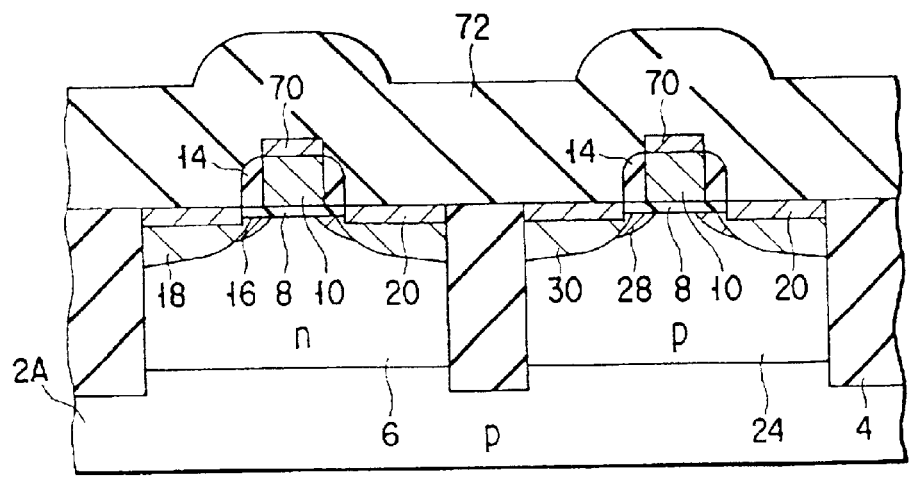
FIG. 29 is a cross sectional view showing another step included in a method of manufacturing a semiconductor device having a salicide structure shown in FIG. 4 according to a sixth embodiment of the present invention.
Figure 30:
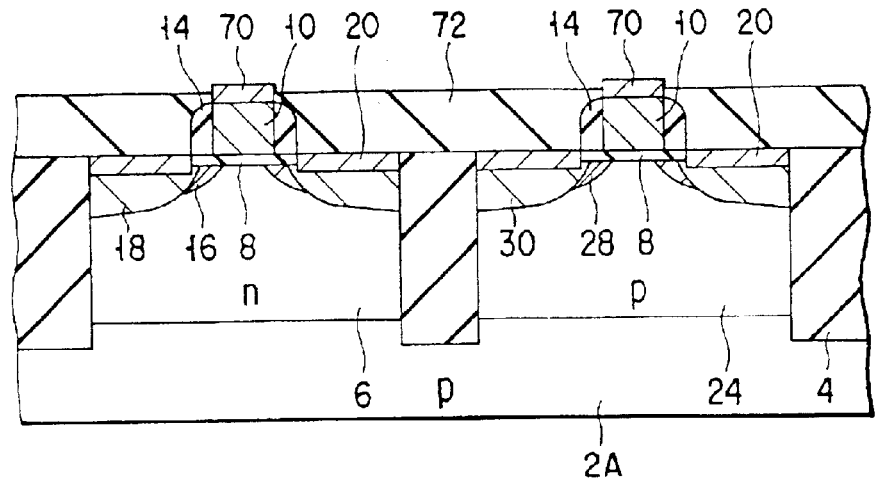
FIG. 30 is a cross sectional view showing another step included in a method of manufacturing a semiconductor device having a salicide structure shown in FIG. 4 according to a sixth embodiment of the present invention.

In the next step, an insulating film 72 consisting of, for example, BPSG is deposited by an LPCVD method in a thickness of about 600 nm on the entire surface of the p-type silicon semiconductor substrate 2A, as shown in FIG. 29. Then, the surface of the insulating film 72 is flattened by a chemical mechanical polishing (CMP) method, followed by etching back the insulating film by a CMP or RIE method using the polycrystalline silicon film 10 as a stopper so as to expose selectively the surface of the titanium silicide film 70 alone, as shown in FIG. 30.

Figure 31:
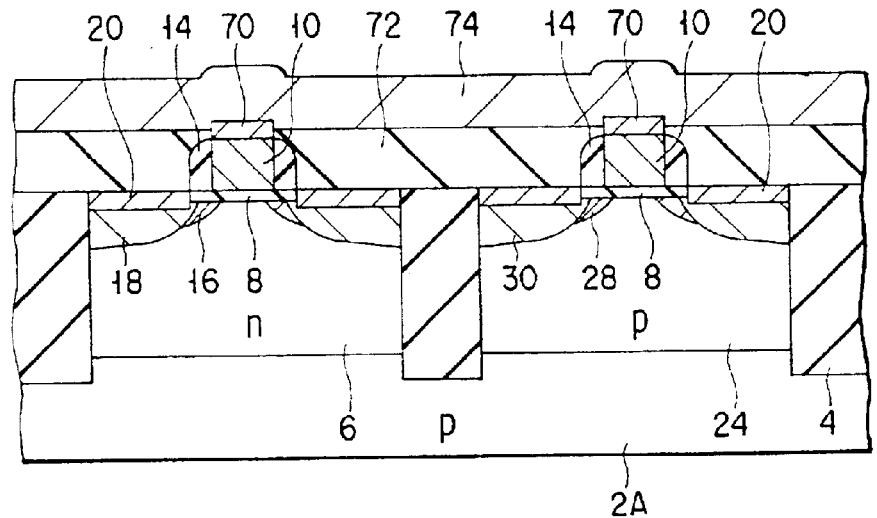
FIG. 31 is a cross sectional view showing another step included in a method of manufacturing a semiconductor device having a salicide structure shown in FIG. 4 according to a sixth embodiment of the present invention.

Then, a titanium layer 74 is deposited by a sputtering method in a thickness of 40 nm, as shown in FIG. 31, followed by applying a heat treatment by RTA at 700° C. for 30 seconds. By this heat treatment, the titanium layer positioned on the titanium silicide film 70, which is formed on the polycrystalline silicon film 10, is converted into a titanium silicide layer. Then, the unreacted titanium layer is selectively removed by a selective removing method using a mixed solution consisting of sulfuric acid and hydrogen peroxide, as shown in FIG. 32, followed by applying a heat treatment by RTA at 850° C. for 20 seconds. As a result, a titanium silicide film 12 is further formed on the titanium silicide film 70.

As described above, an additional titanium silicide film is formed selectively on the titanium silicide film 70, which is positioned on the polycrystalline silicon film 10 acting as a gate electrode. It follows that the titanium silicide film 12 positioned on the polycrystalline silicon film 10 is made at least 1.2 times as thick as the titanium silicide film 20 positioned on the deep diffusion layers 18 and 30.

The semiconductor device having a salicide structure shown in FIG. 4, which is a semiconductor device according to the first embodiment, is prepared by the steps described above. Incidentally, the ordinary manufacturing process of a MOS-FET can be employed in the subsequent steps of manufacturing the semiconductor device.

As described above, according to the sixth embodiment of the present invention, a salicide structure is prepared by the ordinary manufacturing method, followed by selectively exposing the surface of the silicide film positioned on the gate electrode, with the other region covered with an insulating film. Under this condition, a silicide film is newly formed on the silicide film positioned on the gate electrode. It follows that it is possible to manufacture a semiconductor device of a salicide structure, in which the silicide film positioned on the gate electrode is made relatively thicker than the silicide film positioned on the source-drain diffusion layers. It should be noted that the silicide film positioned on the gate electrode is made at least 1.2 times as thick as the silicide film positioned on the source-drain diffusion layers.

In the sixth embodiment described above, each of the silicide film 12 included in the gate electrode and the silicide film 20 positioned on the source-drain diffusion layers consists of titanium silicide. However, these silicide films need not be limited to titanium silicide films. Specifically, it is possible for these silicide films to consist of a silicide of a metal having a high melting point such as cobalt or nickel.

Also, the gate insulating film 8 consists of a silicon oxide film in the sixth embodiment described above. However, another insulating film such as a silicon nitride film or a silicon oxynitride film can be used in place of the silicon oxide film for forming the gate insulating film 8. Further, a p-type silicon semiconductor substrate is used in the fifth embodiment described above. However, it is also possible to use an n-type silicon semiconductor substrate.

As described above, in order to achieve a high speed operation in a semiconductor device of an MIS structure having a salicide structure, it is necessary to decrease the gate delay time. To achieve the object, it is absolutely necessary to decrease the resistance of the gate electrode. It follows that it is necessary to decrease the sheet resistance of the silicide film positioned on the gate electrode. Therefore, it is necessary to increase the thickness of the silicide film positioned on the gate electrode.

On the other hand, in the case of forming a silicide film of an ordinary thickness or a silicide film thicker than the ordinary silicide film, it is necessary to form source-drain diffusion layers to constitute a deep junction in order to prevent the current leakage at the junction in the source-drain diffusion layers. As a result, the occurrence of a short channel effect is rendered prominent, which inhibits the miniaturization of the semiconductor device.

It should be noted in this connection that, in the silicide film positioned on the source-drain diffusion layers, the sheet resistance of the silicide film occupies a small ratio relative to the entire parasitic resistance, with the result that no problem is brought about even if the silicide film is made thinner for miniaturizing the semiconductor device than the silicide film used in the conventional semiconductor device.

On the other hand, the method of the present invention makes it possible to form a silicide film on the gate electrode, which is thicker than that used in the conventional device, and to form a silicide film on the source-drain diffusion layers, which is thinner than that used in the conventional device. In other words, the method of the present invention permits resolving two problems inherent in the conventional method. Specifically, the present invention makes it possible to increase the thickness of the silicide film positioned on the gate electrode and to decrease the thickness of the silicide film positioned on the source-drain diffusion layers simultaneously.

To reiterate, the present invention provides a semiconductor device comprising a MIS transistor having a salicide structure, in which the silicide film positioned on the gate electrode is made at least 1.2 times as thick as the silicide film positioned on the source-drain diffusion layers. The particular semiconductor device of the present invention can be miniaturized and can be operated at a high speed. The present invention also provides a method of manufacturing the particular semiconductor device.

As described above, the present invention is directed to a semiconductor device having a salicide structure, and provides a semiconductor device in which the silicide film positioned on the gate electrode is made thicker than the silicide film positioned on the source-drain diffusion layers so as to make it possible to miniaturize the semiconductor device and to achieve a high speed operation.

The present invention also provides a method of manufacturing a semiconductor device having a salicide structure, in which the silicide film positioned on the gate electrode is made thicker than the silicide film positioned on the source-drain diffusion layers.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device, comprising:

forming a gate insulating film on a semiconductor substrate;

forming a gate electrode on the gate insulating film;

forming a source-drain diffusion layer in the semiconductor substrate;

forming an oxide film on the source-drain diffusion layer;

forming a film of a metal having a high melting point on the gate electrode and on the oxide film; and converting the film of the high melting point metal into a silicide film to form a first suicide film on the source-drain diffusion layer and a second suicide film on the gate electrode, the second suicide film having a thickness greater than that of the first silicide film.

2. A method of manufacturing a semiconductor device, comprising:

forming a gate insulating film on a semiconductor substrate;

forming a gate electrode on the gate insulating film;

forming a source-drain diffusion layer in the semiconductor substrate;

introducing into the source-drain diffusion layer atom which inhibits silicidation;

forming a film of a metal having a high melting point on the gate electrode and the source-drain diffusion layer; and converting the film of the high melting point metal into a suicide film to form a first suicide film on the source-drain diffusion layer and a second suicide film on the gate electrode, the second suicide film having a thickness greater than that of the first suicide film.

3. The method of manufacturing a semiconductor device according to claim 2, wherein said atoms serving to inhibit said silicidation is selected from the group consisting of fluorine, nitrogen and oxygen.

* * * * *